(12) United States Patent
Shin

(10) Patent No.: US 7,872,697 B2
(45) Date of Patent: Jan. 18, 2011

(54) THIN FILM TRANSISTOR ARRAY PANEL FOR LIQUID CRYSTAL DISPLAY CAPABLE OF ACHIEVING AN INVERSION DRIVE

(75) Inventor: Kyoung-Ju Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 557 days.

(21) Appl. No.: 11/451,777

(22) Filed: Jun. 12, 2006

(65) Prior Publication Data
US 2007/0002194 A1 Jan. 4, 2007

(30) Foreign Application Priority Data
Jun. 14, 2005 (KR) ...................... 10-2005-0051023

(51) Int. Cl.
*G02F 1/136* (2006.01)
*G02F 1/1343* (2006.01)
*G09G 3/36* (2006.01)
*H01L 29/04* (2006.01)

(52) U.S. Cl. ............................. 349/42; 349/43; 349/38; 349/39; 349/143; 349/144; 257/59; 257/72; 345/92

(58) Field of Classification Search ............. 349/42–47, 349/38–39, 140–144; 257/59, 72; 345/92
See application file for complete search history.

(56) References Cited

U.S. PATENT DOCUMENTS

| 6,590,555 | B2 * | 7/2003 | Su et al. ........................ 345/92 |
| 6,936,845 | B2 * | 8/2005 | Kim et al. ...................... 257/59 |
| 7,345,730 | B2 * | 3/2008 | Kim et al. .................... 349/145 |
| 2005/0078253 | A1 * | 4/2005 | Kim et al. .................... 349/139 |
| 2006/0164565 | A1 * | 7/2006 | Lee et al. ....................... 349/43 |

* cited by examiner

*Primary Examiner*—Hoan C Nguyen
(74) *Attorney, Agent, or Firm*—Innovation Counsel LLP

(57) ABSTRACT

A VA mode LCD obtains a wide viewing angle without forming cutouts or protrusions in the common electrode. A pixel electrode has a cutout; a direction control electrode overlaps the cutout; a first storage electrode overlaps the pixel electrode; and a second storage electrode overlaps the direction control electrode. The pixel electrode has plurality of partitions, each partition has two major edges that are parallel to each other. In the present invention, the electric field generated by the direction control electrode pre-tilts the LC molecules by maintaining the direction control electrode voltage with respect to the common voltage higher than the pixel electrode voltage with respect to the common voltage. The LC molecules in each partition receive horizontal components of electric fields that are substantially perpendicular to the major edges thereby sorting the LC molecules into four tilt directions and thus widening the reference viewing angle according to the tilt directions of the LC molecules.

19 Claims, 21 Drawing Sheets

THIN FILM TRANSISTOR ARRAY PANEL FOR LIQUID CRYSTAL DISPLAY CAPABLE OF ACHIEVING AN INVERSION DRIVE

REFERENCE TO RELATED APPLICATION

This application claims priority to and the benefit of Korean Patent Application No. 10-2005-0051023 filed in the Korean Intellectual Property Office on Jun. 14, 2005, the entire contents of which are incorporated herein by reference.

FIELD OF THE INVENTION

The present invention relates to a thin film transistor (TFT) array panel and a liquid crystal display including the same.

DESCRIPTION OF THE RELATED ART

A liquid crystal display (LCD) generally includes an upper panel provided with a common electrode and color filters, a lower panel provided with thin film transistors (TFTs) and pixel electrodes, and a liquid crystal (LC) layer interposed therebetween. The pixel electrodes and the common electrode are supplied with different voltages to generate an electric field in the LC layer that determines orientations of LC molecules therein. Since the orientations of LC molecules determine the transmittance of incident light, the LCD can display desired images by adjusting voltage differences between the two electrodes. The vertical alignment (VA) LCD, which aligns LC molecules such that long axes of the LC molecules are perpendicular to the panels in the absence of an electric field, is preferred because of its high contrast ratio and wide reference viewing angle. The reference viewing angle is defined as the viewing angle where the contrast ratio equals 1:10 or as the limit angle for the inversion in luminance between the grays.

The wide viewing angle of the VA mode LCD can be realized by using cutouts in the field-generating electrodes and protrusions on the field-generating electrodes. Since the cutouts and the protrusions determine the tilt directions of the LC molecules, the tilt directions can be distributed into several directions by disposing the cutouts and the protrusions in various ways such that the reference viewing angle is widened. However, in the method of forming cutouts in the pixel electrodes and the common electrode, an additional mask for patterning the common electrode is required, and an overcoat on the color filters is required for preventing contamination of the LC layer by pigments of the color filters leaking through the cutouts in the common electrode. The method of forming protrusions also complicates the manufacture of the LCD because of the additional process step for forming the protrusions. Moreover, the VA mode LCD having protrusions or cutouts has a problem in that the response speed of the display device is slowed since the LC molecules far from the protrusions or cutouts are under weak control while the LC molecules near the protrusions or cutouts are strongly controlled.

SUMMARY OF THE INVENTION

In accordance with the present invention, a VA mode LCD obtains a wide viewing angle without forming cutouts or protrusions in the common electrode. A pixel electrode has a cutout; a direction control electrode overlaps the cutout; a first storage electrode overlaps the pixel electrode; and a second storage electrode overlaps the direction control electrode. The pixel electrode has plurality of partitions, each partition has two major edges that are parallel to each other. In the present invention, the electric field generated by the direction control electrode pre-tilts the LC molecules by maintaining the direction control electrode voltage with respect to the common voltage higher than the pixel electrode voltage with respect to the common voltage. The LC molecules in each partition receive horizontal components of electric fields that are substantially perpendicular to the major edges thereby sorting the LC molecules into four tilt directions and thus widening the reference viewing angle according to the tilt directions of the LC molecules.

DETAILED DESCRIPTION

Figure 1:
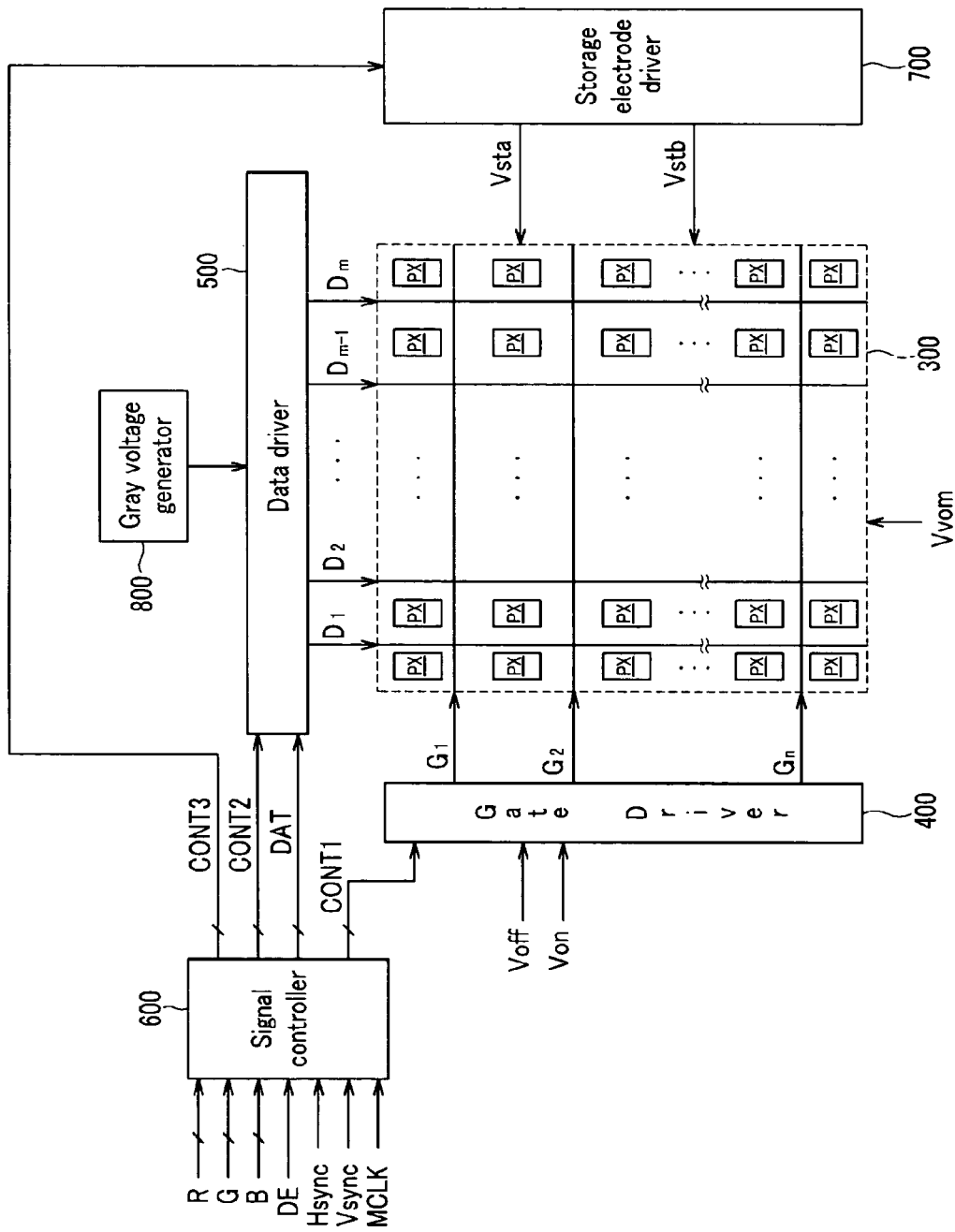
FIG. 1 is a block diagram of an LCD according to an embodiment of the present invention.
Figure 2:
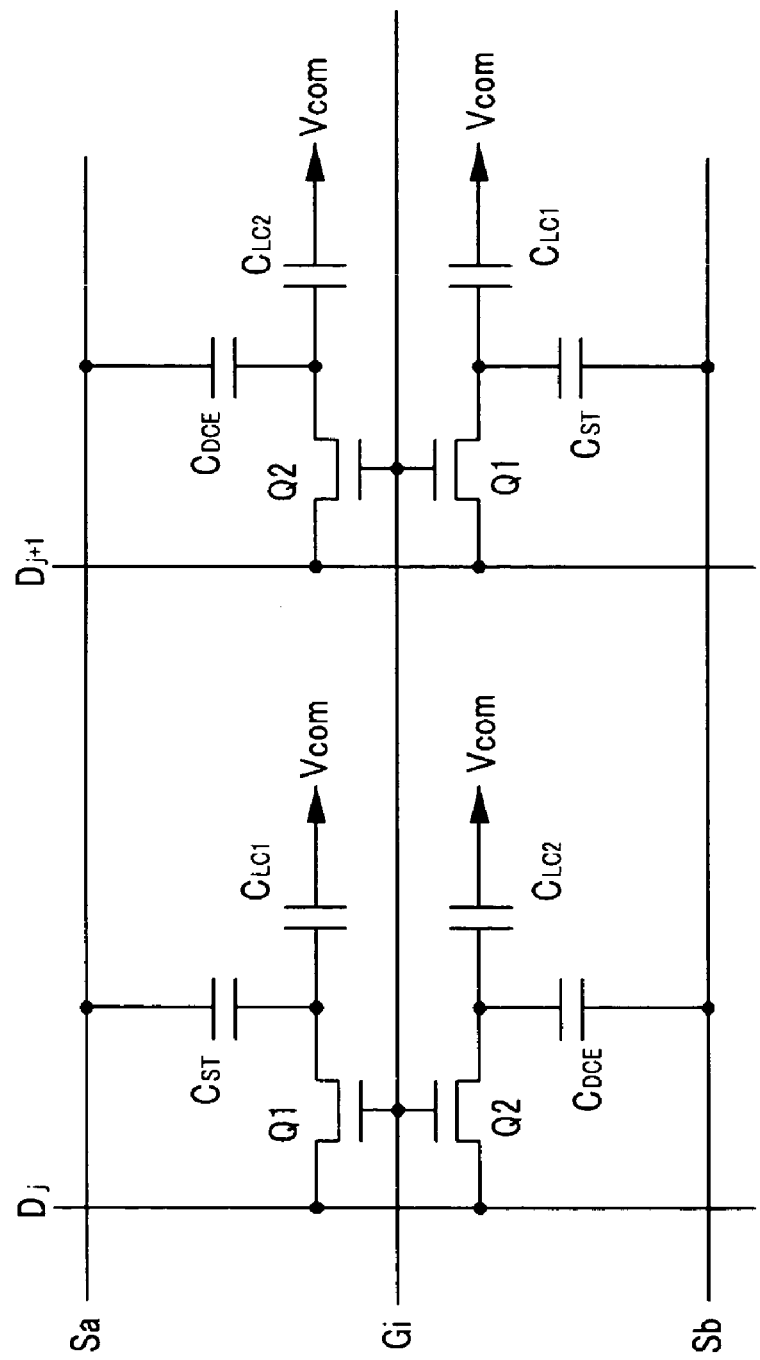
FIG. 2 is an equivalent circuit diagram of two pixels of an LCD according to an embodiment of the present invention.
Figure 3:
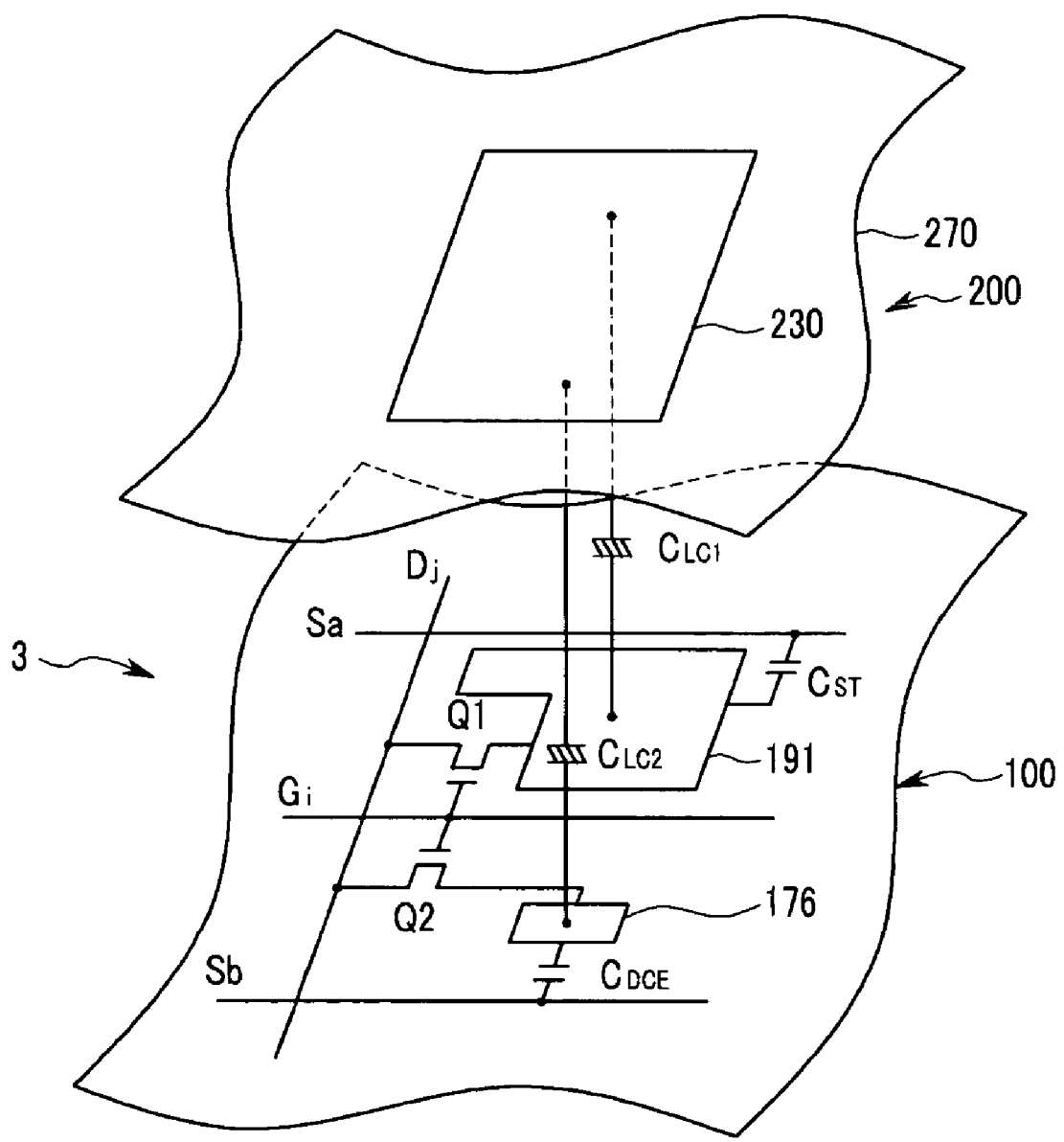
FIG. 3 is an equivalent circuit diagram of a pixel of an LCD according to an embodiment of the present invention.

FIG. 1 is a block diagram of an LCD according to an embodiment of the present invention, FIG. 2 is an equivalent circuit diagram of two pixels of an LCD according to an embodiment of the present invention, and FIG. 3 is an equivalent circuit diagram of a pixel of an LCD according to an embodiment of the present invention. Referring to FIGS. 1 to 3, the LCD includes a liquid crystal panel assembly 300, a gate driver 400, a data driver 500, and a storage electrode driver 700 connected to the liquid crystal panel assembly 300, a gray voltage generator 800 connected to the data driver 500, and a signal controller 600 for controlling the above elements.

The liquid crystal panel assembly 300 includes a plurality of display signal lines $G_1$-$G_n$ and $D_1$-$D_m$, and a plurality of pixels connected thereto and arranged approximately in a matrix, as seen in the equivalent circuit diagram. The liquid crystal panel assembly 300 also includes lower and upper panels 100 and 200 that face each other with a liquid crystal layer 3 interposed therebetween, as seen in FIG. 3. Gate lines $G_1$-$G_n$ transmit gate signals (also referred to as "scanning signals") while data lines $D_1$-$D_m$ transmit data signals to the pixel array. A plurality of pairs of first and second storage electrode lines Sa and Sb transmit storage electrode signals. The gate lines $G_1$-$G_n$ extend substantially in a row direction and are substantially parallel to each other, and the data lines $D_1$-$D_m$ extend substantially in a column direction and are substantially parallel to each other.

Each pixel PX, for example the pixel PX connected to the i-th (i=1, 2, ..., n) gate line $G_i$ and the j-th (j=1, 2, ..., m) data line $D_j$, includes a first and a second switching element Q1 and Q2 connected to the signal lines $G_i$ and $D_j$, a primary liquid crystal capacitor $C_{LC1}$ and a storage capacitor $C_{ST}$ that are connected to the first switching element Q1, and a subordinate liquid crystal capacitor $C_{LC2}$ and a direction control capacitor $C_{DCE}$ that are connected to the first switching element Q2. The first and second switching elements Q1 and Q2 are three-terminal TFT elements provided on the lower panel 100. The control terminal of the first switching element Q1 is connected to the gate line $G_i$, the input terminal thereof is connected to the data line $D_j$, and the output terminal thereof is connected to the primary liquid crystal capacitor $C_{LC1}$ and the storage capacitor $C_{ST}$. The control terminal of the second switching element Q2 is connected to the gate line $G_i$, the input terminal thereof is connected to the data line $D_j$, and the output terminal thereof is connected to the subordinate liquid crystal capacitor $C_{LC2}$ and the direction control capacitor $C_{DCE}$.

The primary liquid crystal capacitor $C_{LC1}$ includes a pixel electrode 191 provided on the lower panel 100 and a common electrode 270 provided on the upper panel 200 as two terminals, and the subordinate liquid crystal capacitor $C_{LC2}$ includes a direction control electrode 176 and a common electrode 270 provided on the upper panel 200 as two terminals. The LC layer 3 disposed between the electrodes 191, 176, and 270 functions as a dielectric. The pixel electrode 191 is connected to the first switching element Q1, and the direction control electrode 176 is connected to the second switching element Q2. The common electrode 270 is formed on the entire surface of the upper panel 200 and is supplied with a common voltage Vcom.

The storage capacitor $C_{ST}$ is formed by overlapping the first or the second storage electrode line Sa or Sb provided on the lower panel 100 with the pixel electrode 191 via an insulator disposed therebetween, and the direction control capacitor $C_{DCE}$ is formed by overlapping the second or the first storage electrode line Sb or Sa with the direction control electrode 176 via an insulator disposed therebetween. The storage capacitor $C_{ST}$ and the direction control capacitor $C_{DCE}$ are respectively connected to the storage electrode lines Sa and Sb opposing each other. For example, the direction control capacitor $C_{DCE}$ is connected to the second storage electrode Sb when the storage capacitor $C_{ST}$ is connected to the first storage electrode line Sa, and oppositely, the direction control capacitor $C_{DCE}$ is connected to the first storage electrode line Sa when the storage capacitor $C_{ST}$ is connected to the second storage electrode line Sb. The first and second storage electrode lines Sa and Sb are supplied with storage electrode signals Vsta and Vstb, respectively.

In order to implement color display, each pixel PX uniquely displays one of primary colors (spatial division) or each pixel PX sequentially displays the primary colors in turn (temporal division) such that the spatial or temporal sum of the primary colors is recognized as a desired color. An example of a set of the primary colors includes red, green, and blue colors. FIG. 3 shows an example of the spatial division in which each pixel includes a color filter 230 representing one of the primary colors in an area of the upper panel 200 facing the pixel electrode 191. Unlike FIG. 3, the color filter 230 may be provided on or under the pixel electrode 191 on the lower panel 100.

Adjacent pixels PX are opposite each other in the relationship of connection to the first and second storage electrode lines Sa and Sb. In other words, when the storage capacitor $C_{ST}$ (direction control capacitor $C_{DCE}$) of a pixel PX is connected to the first storage electrode line Sa, the storage capacitors $C_{ST}$ (direction control capacitors $C_{DCE}$) of the upper, lower, right, and left pixels are connected to the second storage electrode line Sb.

Figure 4:
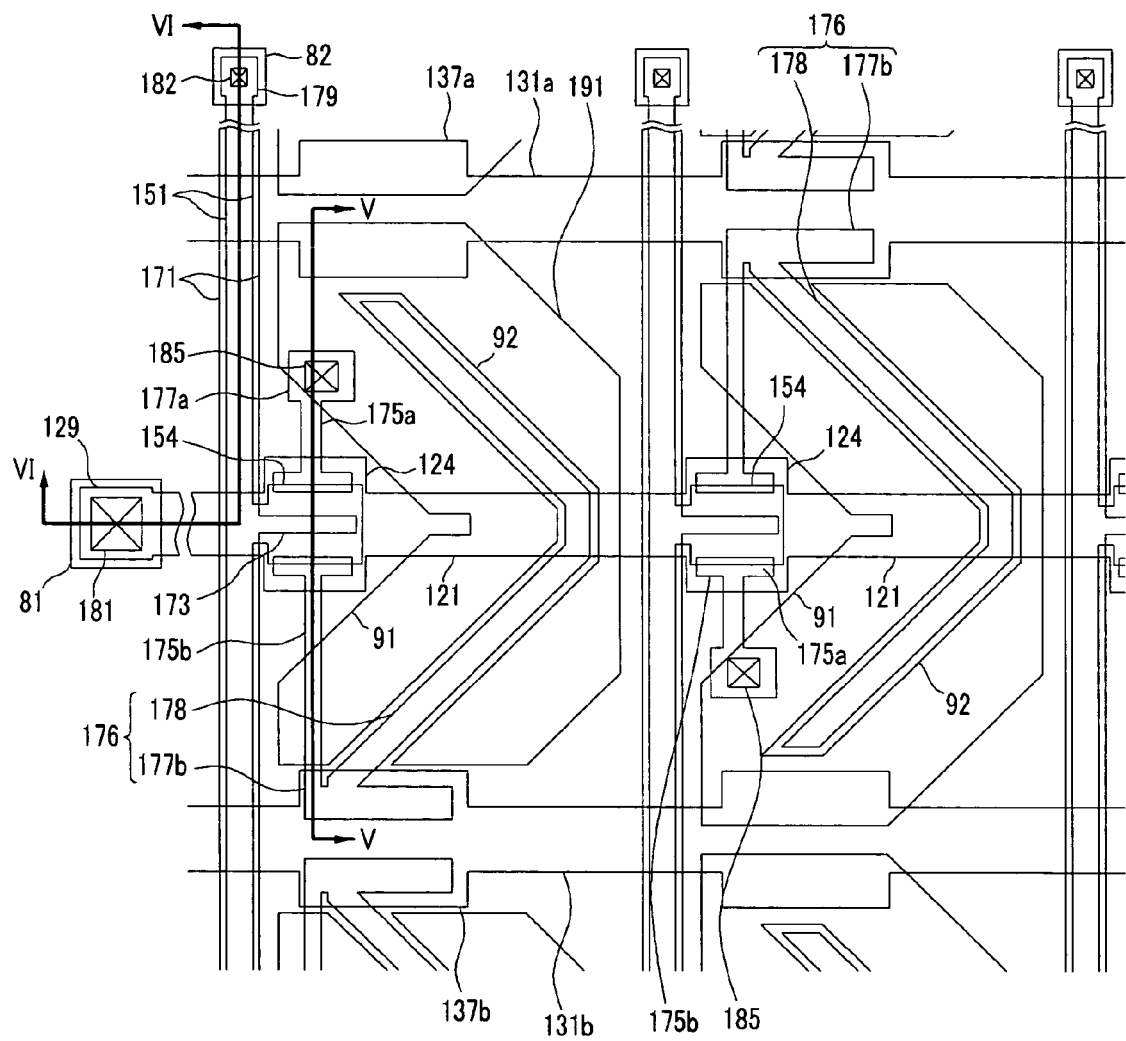
FIG. 4 is a layout view of an LCD according to an embodiment of the present invention.
Figure 5:
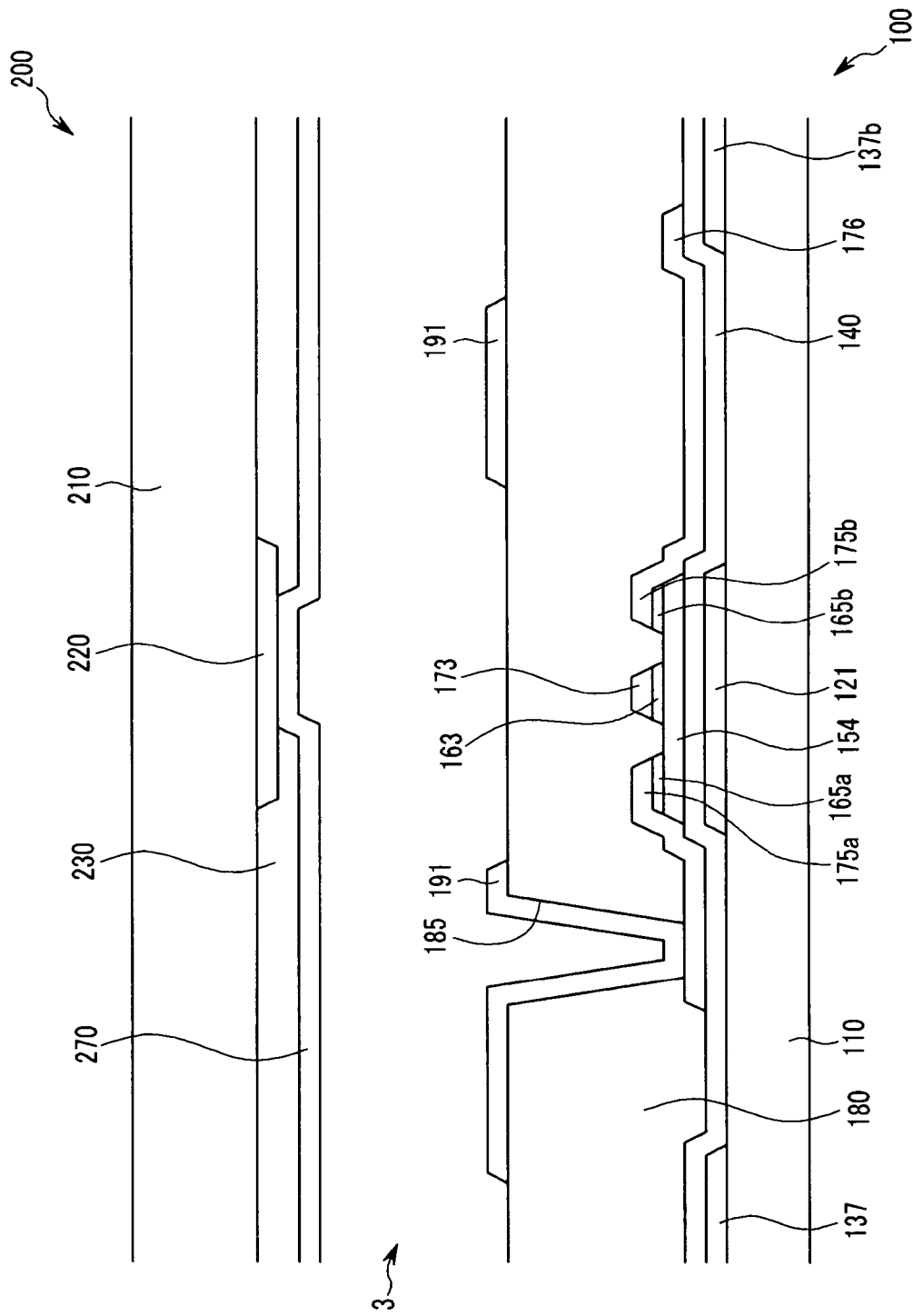
FIGS. 5 and 6 are sectional views of the LCD shown in FIG. 4 taken along the line V-V and the line VI-VI, respectively.
Figure 6:
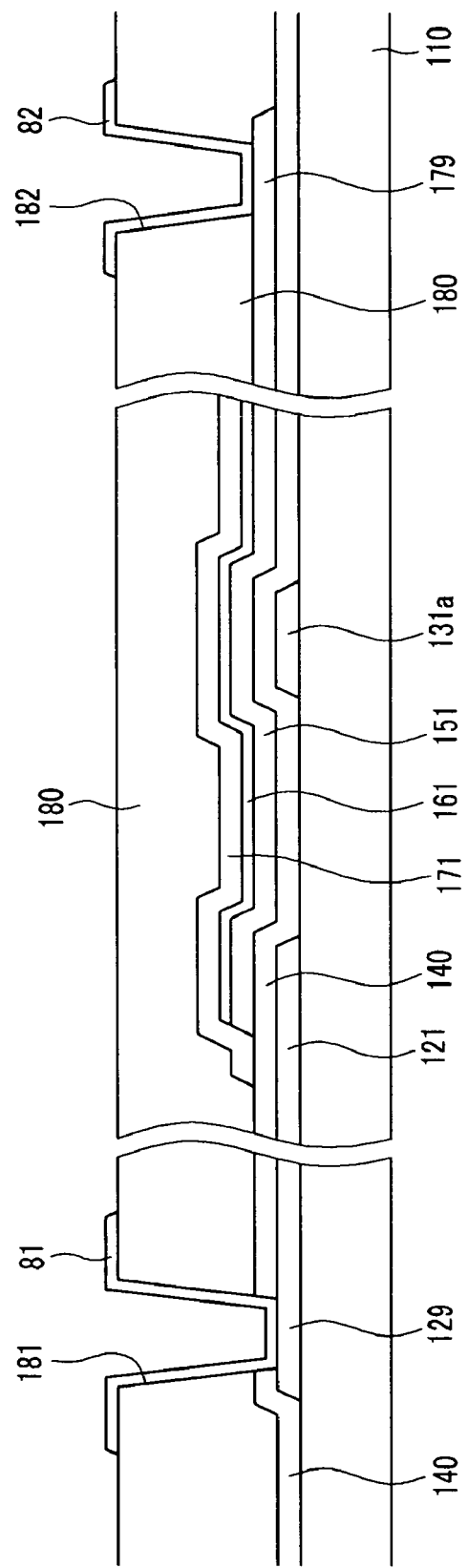

The liquid crystal panel assembly 300 mentioned above will be described in detail with reference to FIGS. 4 to 6. FIG. 4 is a layout view of an LCD according to an embodiment of the present invention, and FIGS. 5 and 6 are sectional views of the LCD shown in FIG. 4 taken along the line V-V and the line VI-VI, respectively. Referring to FIGS. 4 to 6, the liquid crystal panel assembly according to an embodiment of the present invention includes a thin film transistor array panel 100, a common electrode panel 200, and a LC layer 3 interposed therebetween.

First, the TFT array panel 100 is now described in detail. A plurality of gate lines 121 and a plurality of pairs of first and second storage electrode lines 131*a* and 131*b* are formed on an insulating substrate 110 that is preferably made of transparent glass or plastic. The gate lines 121 for transmitting gate signals extend substantially in a transverse direction. Each of the gate lines 121 includes a plurality of gate electrodes 124 that protrude upward and downward and an end portion 129 having a large area for connection with another layer or a gate driver 400. The first and second storage electrode lines 131*a* and 131*b* are supplied with a predetermined voltage and extend nearly parallel to the gate line 121. The first and second storage electrode lines 131*a* and 131*b* are disposed opposite each other with an adjacent gate line 121 located therebetween, and include a plurality of pairs of storage electrodes 137*a* and 137*b* that extend upward and downward. However, the shape and disposition of the storage electrode lines 131*a* and 131*b* may be variously changed.

The gate lines 121 and the storage electrode lines 131*a* and 131*b* are preferably made of an Al-containing metal such as Al and an Al alloy, a Ag-containing metal such as Ag and a Ag alloy, a Cu-containing metal such as Cu and a Cu alloy, a Mo-containing metal such as Mo and a Mo alloy, Cr, Ta, and Ti. However, the gate lines 121 and the storage electrode lines 131*a* and 131*b* may have a multi-layered structure including two conductive films (not shown) having different physical characteristics. One of the two conductive films is preferably made of a low resistivity metal such as an Al-containing metal, a Ag-containing metal, or a Cu-containing metal for reducing signal delay or voltage drop. On the other hand, the other conductive film is preferably made of a material such as a Mo-containing metal, Cr, Ti, and Ta, which has good physical, chemical, and electrical contact characteristics with other materials such as indium tin oxide (ITO) or indium zinc oxide (IZO). Good exemplary combinations of the two film materials are a pair of a lower Cr film and an upper Al (alloy) film and a pair of a lower Al (alloy) film and an upper Mo (alloy) film. However, the gate line 121 and the storage electrode line 131 may be made of many various metals or conductive materials besides the above.

The lateral sides of the gate lines 121 and the storage electrode lines 131*a* and 131*b* are inclined relative to a surface of the substrate 110, and the preferable inclination angle thereof ranges from about 30° to about 80°. A gate insulating layer 140 preferably made of silicon nitride (SiNx) or silicon oxide (SiOx) is formed on the gate lines 121 and the storage electrode lines 131*a* and 131*b*. A plurality of semiconductor stripes 151 preferably made of hydrogenated amorphous silicon (abbreviated as "a-Si") or polysilicon are formed on the gate insulating layer 140. Each semiconductor stripe 151 extends substantially in the longitudinal direction and has a plurality of projections 154 branched out toward the gate electrodes 124.

A plurality of ohmic contact stripes 161 and a plurality of pairs of ohmic contact islands 165*a* and 165*b* are formed on the semiconductor stripes 151. The ohmic contacts 161, 165*a*, and 165*b* are preferably made of n+ hydrogenated a-Si heavily doped with an n-type impurity such as phosphorus (P) or silicide. Each ohmic contact stripe 161 has a plurality of projections 163, and each pair of the ohmic contact islands 165*a* and 165*b* are located on both sides of the projection 163 respectively and on the projection 154 of the semiconductor stripe 151.

The lateral sides of the semiconductors 151 and 154 and the ohmic contacts 161, 165*a*, and 165*b* are inclined relative to a surface of the substrate 110, and the preferable inclination angle thereof ranges from about 30° to about 80°. A plurality of data lines 171 and a plurality of first and second drain electrodes 175*a* and 175*b* are formed on the ohmic contacts 161, 165*a*, and 165*b* and the gate insulating layer 140. The data lines 171 for transmitting data signals extend substantially in the longitudinal direction and intersect the gate lines 121. Each data line 171 includes a plurality of source electrodes 173 branched out toward the gate electrodes 124 and an end portion having a large area for connection with another layer or a data driver 500.

The first and second drain electrodes 175*a* and 175*b* are separated from each other and the data lines 171, and are disposed opposite each other with respect to a source electrode 173. The first drain electrode 175*a* has an end portion located on the projection 154 of the semiconductor 151 and another end portion 177*a* on the opposite side and having a large area. The second drain electrode 175*b* has an end portion located on the projection 154 of the semiconductor 151 and a direction control electrode 176 connected to the end portion, and the direction control electrode 176 includes an expansion 177*b* located on the second/first storage electrode 137*b*/137*a* and a bent portion 178 extending from the expansion 177*b*. The bent portion 178 extends obliquely in the right and up/down direction from an expansion 177*b* to meet a gate line 121, and at the point of meeting the gate line 121, it turns to the left and up/down direction to extend to the vicinity of the first/second storage electrode 137*a*/137*b*. The angle between the bent portion 178 and the gate line 121 is about 45°.

A gate electrode 124, a source electrode 173, and a first drain electrode 175*a*, along with a projection 154 of a semiconductor 151, form a first TFT having a channel formed in the projection 154 disposed between the source electrode 173 and the first drain electrode 175*a*. Also, a gate electrode 124, a source electrode 173, and a second drain electrode 175*b*, along with a projection 154 of a semiconductor 151, form a second TFT having a channel formed in the projection 154 disposed between the source electrode 173 and the second drain electrode 175*b*.

A direction control electrode 176 and the common electrode on the common electrode panel 200 form a subordinate liquid crystal capacitor $C_{LC2}$, and an expansion 177*b* of the direction control electrode 176 and a storage electrode 137*b* of the second storage electrode line 131*b* form a direction control capacitor $C_{DCE}$.

The data lines 171 and the drain electrodes 175 are preferably made of a refractory metal such as Mo, Cr, Ta, and Ti or an alloy thereof. Also, the data lines 171 and the drain electrodes 175 may have a multi-layered structure including a refractory metal film (not shown) and a conductive film (not shown) having low resistivity. An example of the multi-layered structure includes double layers of a lower Cr or Mo (alloy) film and an upper Al (alloy) film, and triple layers of a lower Mo (alloy) film, an intermediate Al (alloy) film, and an upper Mo (alloy) film. However, the data lines 171 and the drain electrodes 175 may be made of many various other metals or conductive materials besides the above. The lateral sides of the data lines 171 and the drain electrodes 175 are also inclined relative to a surface of the substrate 110, and the inclination angles thereof are preferably in a range of about 30° to about 80°.

The ohmic contacts 161, 165*a*, and 165*b* are interposed only between the underlying semiconductors 151 and 154 and the overlying data lines 171 and drain electrodes 175 thereon, and reduce the contact resistance therebetween. The semiconductors 151 and 154 include exposed portions that are not covered with the data lines 171 and the drain electrodes 175 such as portions located between the source electrodes 173 and the drain electrodes 175. A passivation layer 180 is formed on the data lines 171, the drain electrodes 175, and the exposed portions of the semiconductor stripes 151.

The passivation layer 180 is preferably made of an inorganic insulator or an organic insulator, and the surface thereof may be flat. Examples of the inorganic insulator include silicon nitride and silicon oxide. The organic insulator may have photosensitivity, and the preferable dielectric constant thereof is lower than about 4.0. However, the passivation layer 180 may have a double-layered structure including a lower inorganic film and an upper organic film in order to protect the exposed portions of the semiconductor stripes 151 and to benefit from the substantial insulating property of an organic film.

The passivation layer 180 has a plurality of contact holes 182 and 185 exposing the end portions 179 of the data lines 171 and the first drain electrodes 175a, respectively. The passivation layer 180 and the gate insulating layer 140 have a plurality of contact holes 181 exposing the end portions 129 of the gate lines 121. A plurality of pixel electrodes 191 and a plurality of contact assistants 81 and 82 are formed on the passivation layer 180. The pixel electrodes 191 are physically and electrically connected with the first drain electrodes 175a through the contact holes 185 and are supplied with data voltages from the first drain electrodes 175a. The pixel electrodes 191 that are supplied with the data voltages generate electric fields in cooperation with the common electrode 270 on the common electrode panel 200 that is supplied with a common voltage so that orientations of the liquid crystal molecules in the liquid crystal layer 3 interposed between the two electrodes are determined. In accordance with the determined orientations of the liquid crystal molecules, the polarization of light passing through the liquid crystal layer is varied. A pixel electrode 191 and the common electrode 270 form a primary liquid crystal capacitor $C_{LC1}$ to store applied voltages even after the TFT is turned off.

A pixel electrode 191 and a first/second storage electrode line 131a/131b including a first/second storage electrode 137a/137b form a storage capacitor $C_{ST}$ that enhances the voltage storing capacity of the liquid crystal capacitor. Each pixel electrode 191 has chamfered right corners, and the chamfered oblique edges of the pixel electrode 191 make an angle of about 45° with the gate lines 121. Each pixel electrode 191 has first and second cutouts 91 and 92. The first cutout 91 extends shortly along the gate line 121 and has an inlet toward the left edge. The inlet of the first cutout 91 has a pair of oblique edges that are parallel to the bent portion 178 of the direction control electrode 176. The second cutout 92 extends along the bent portion 178 of the direction control electrode 176 and exposes the entire bent portion 178 of the direction control electrode 176.

The first and second cutouts 91 and 92 have approximate inversion symmetry with respect to the gate line 121 which is located to bisect the pixel electrodes 191. Therefore, the lower half of the pixel electrode 191 is partitioned into two partitions by the second cutout 92, and the upper half of the pixel electrode 191 is also partitioned into two partitions by the second cutout 92. The number of the partitions or the number of the cutouts is varied depending on the design factors such as the size of the pixel electrodes 191, the ratio of the transverse edges and the longitudinal edges of the pixel electrodes 191, the type and characteristics of the liquid crystal layer 3, and so on. However, in the case of many cutouts, it is preferable to alternately dispose the cutouts that overlap the direction control electrodes 176 with the cutouts that don't overlap the direction control electrodes 176.

The contact assistants 81 and 82 are connected to the end portion 129 of the gate line 121 and the end portion 179 of the data line 171 through the contact holes 181 and 182, respectively. The contact assistants 81 and 82 supplement the adhesive property of the end portions 129 of the gate lines 121 and the end portions 179 of the data lines 171 to exterior devices, and protect them.

Next, the color filter array panel 200 is described. A light blocking member 220 is formed on a substrate 210. The light blocking member 220 is also called a black matrix, and it defines a plurality of opening areas opposed to the pixel electrodes 191 and also prevents the leakage of light between the pixel electrodes 191. A plurality of color filters 230 are also formed on the substrate 210 and disposed substantially in the opening areas surrounded by the light blocking member 220. The color filters 230 may extend in the longitudinal direction along the pixel electrodes 191 to form a stripe. Each color filter 230 may represent one of three primary colors such as red, green, and blue colors.

A common electrode 270 is formed on the color filters 230 and the light blocking member 220. Since cutouts are not needed on the common electrode 270, the common electrode 270 has a continuous surface. Also, no protrusion is needed on the common electrode 270. The common electrode 270 is preferably made of a transparent conductive material such as ITO or IZO. An alignment layer (not shown) for alignment of the liquid crystal layer 3 is coated on inner surfaces of the panels 100 and 200, and one or more polarizers (not shown) are provided on outer surfaces of the panels 100 and 200.

Referring to FIG. 1 again, the gray voltage generator 800 generates two sets of a plurality of gray voltages (or reference gray voltages) related to the transmittance of the pixels PX. The gray voltages in one set have a positive polarity with respect to the common voltage Vcom, while those in the other set have a negative polarity with respect to the common voltage Vcom. The gate driver 400 is connected to the gate lines $G_1$-$G_n$ of the liquid crystal panel assembly 300 and synthesizes the gate-on voltage Von and the gate-off voltage Voff to generate gate signals, which are applied to the gate lines $G_1$-$G_n$.

Data driver 500 is connected to the data lines $D_1$-$D_m$ of the liquid crystal panel assembly 300 and applies data voltages, which are selected from the gray voltages supplied from the gray voltage generator 800, to the data lines $D_1$-$D_m$. However, when the gray voltage generator 800 doesn't supply the voltages for all grays, but supplies only the reference gray voltages of a predetermined number, the data driver 500 divides the reference gray voltages to generate gray voltages for all grays from which data signals are selected.

Storage electrode driver 700 is connected to the first and second storage electrode lines Sa and Sb, and applies a pair of storage electrode signals Vsta and Vstb having opposite phases to the first and second storage electrode lines Sa and Sb, respectively. Signal controller 600 controls the gate driver 400 and the data driver 500. Each of the drivers 400, 500, 600, and 800 mentioned above may be directly mounted on the liquid crystal panel assembly 300 in the form of at least one integrated circuit (IC) chip, or may be mounted on a flexible printed circuit film (not shown) to be attached to the liquid crystal panel assembly 300 in a tape carrier package (TCP) form, or may be mounted on a separate printed circuit board (not shown). On the other hand, the drivers 400, 500, 600, and 800 may be integrated with the liquid crystal panel assembly 300 along with the signal lines $G_1$-$G_n$, $D_1$-$D_m$, Sa, and Sb, and the TFT switching elements Q1 and Q2. Also, the drivers 400, 500, 600, and 800 may be integrated into a single chip, and here, at least one thereof or at least one circuit element forming them may be located outside of the single chip.

Next, the operation of the liquid crystal display mentioned above will be described in detail. The signal controller 600 receives input image signals R, G, and B and input control signals for controlling the display of the image signals from an external graphics controller (not shown). An example of the input control signals includes a vertical synchronization signal Vsync, a horizontal synchronization signal Hsync, a main clock signal MCLK, and a data enable signal DE.

Signal controller 600 processes the input image signals R, G, and B suitably for the operation condition of the liquid crystal panel assembly 300 on the basis of the input image signals R, G, and B and the input control signals, and generates gate control signals CONT1, data control signals CONT2, and storage electrode control signals CONT3. Then, the signal controller 600 transmits the gate control signals CONT1 to the gate driver 400, the data control signals CONT2 and the processed image signals DAT to the data driver 500, and the storage electrode control signals CONT3 to the storage electrode driver 700.

Gate control signals CONT1 include a scanning start signal STV for instructing to start scanning, and at least one clock signal for controlling the output time of the gate-on voltage Von. The gate control signals CONT1 may further include an output enable signal OE for defining the duration of the gate-on voltage Von. The data control signals CONT2 include a horizontal synchronization start signal STH for informing of a start of image data transmission for a row of pixels PX, a load signal LOAD for instructing to apply the data voltages to the data lines $D_1$-$D_m$, and a data clock signal HCLK. The data control signal CONT2 may further include an inversion signal RVS for reversing the polarity of the data signals with respect to the common voltage Vcom (hereinafter, "the polarity of the data signals with respect to the common voltage Vcom" is referred to as "the polarity of the data signals").

Storage electrode driver 700 applies the first and second storage electrode signals Vsta and Vstb to the first and second storage electrode lines Sa and Sb, respectively, according to the storage electrode control signals CONT3 from the signal controller 600. The first and second storage electrode signals Vsta and Vstb reverse periodically with respect to the common voltage Vcom, and their phases are opposite each other.

In accordance with the data control signals CONT2 from the signal controller 600, the data driver 500 sequentially receives the digital image signals DAT for a row of pixels PX, selects gray voltages corresponding to the respective digital image signal DAT, converts the digital image signals DAT into analog data signals, and applies the analog data signals to the corresponding data lines $D_1$-$D_m$. The gate driver 400 sequentially applies the gate-on voltage $V_{on}$ to the gate lines $G_1$-$G_n$ in response to the gate control signals CONT1 from the signal controller 600, thereby turning on the first and second switching elements Q1 and Q2 that are connected to the gate lines $G_1$-$G_n$. Then, the data signals applied to the data lines $D_1$-$D_m$ are applied to the corresponding pixels PX through the first and second turned-on switching elements Q1 and Q2.

The difference between the voltage of the data signal applied to the pixel PX and the common voltage Vcom appears as a charge voltage of the primary LC capacitor $C_{LC1}$, that is, a primary pixel electrode voltage. Also, the difference between the voltage of the data signal applied to the direction control electrode 176 and the common voltage Vcom appears as a charge voltage of the subordinate LC capacitor $C_{LC2}$, that is, a subordinate pixel electrode voltage. When the switching elements Q1 and Q2 are turned off, the pixel electrodes 191 and the direction control electrodes 176 are in a floating state. However, since the pixel electrode 191 and the direction control electrode 176 form capacitors $C_{ST}$ and $C_{DCE}$ along with the first and second storage electrode lines 131a and 131b respectively, the voltages of the pixel electrode 191 and the direction control electrode 176 vary according to the variation of voltages of the first and second storage electrode lines 131a and 131b, and the voltages of the two electrodes 191 and 176 vary. The average voltage of the direction control electrode 176 with respect to the common voltage Vcom may be higher than the average voltage of the pixel electrode 191 with respect to the common voltage Vcom by adjusting the polarities of the first and second storage electrode signals Vsta and Vstb.

When a voltage difference is applied between the common electrode 270, and the pixel electrode 191 and the direction control electrode 178, a primary electric field that is almost perpendicular to the panels 100 and 200 is generated. The LC molecules respond to the electric field so that long axes thereof are rearranged to be vertical to the primary electric field. Hereinafter, the pixel electrodes 191 and the common electrode 270 are together referred to as electric field generating electrodes.

The cutouts 91 and 92 and the edges of the pixel electrode 191 distort the electric field to generate a horizontal component for determining the tilt direction of the LC molecules. The horizontal component of the primary electric field is almost perpendicular to the edges of the cutouts 91 and 92 and the edges of the pixel electrode 191, and the direction thereof is inward or outward in accordance with the polarity of the voltages of the pixel electrode 191. For example, if the voltage of the pixel electrode 191 is higher than the common voltage Vcom, the horizontal component is toward the inside of the pixel electrode 191.

Since there is a voltage difference between the direction control electrode 178 and the pixel electrode 191, a subordinate electric field is generated according to the voltage difference, and the subordinate electric field has a horizontal component that is substantially parallel to the horizontal component of the primary electric field. As described above, since the voltage of the direction control electrode 178 (with respect to the common voltage Vcom) is higher than the voltage of the pixel electrode 191, the horizontal component of the subordinate electric field is in the opposite direction of the horizontal component of the primary electric field and the strength thereof is also stronger than the horizontal component of the primary electric field. Therefore, the pure horizontal component of the electric field at the cutout 92 where the direction control electrode 178 is located is in the same direction as the horizontal component at the edge of the adjacent pixel electrode 191.

As described above, the second cutout 92 partitions the pixel electrode 191 into a plurality of partitions, and each partition has two major edges that are parallel to each other. Since the LC molecules in each partition receive forces of the horizontal components of the electric fields that are substantially perpendicular to the major edges and in the direction as mentioned above, the tilt directions are sorted into about four directions. In this way, the reference viewing angle is widened by varying the tilt directions of the LC molecules.

The arrangement of LC molecules varies depending on the size of the primary and subordinate pixel electrode voltages, and thus the polarization of light passing through the LC layer 3 varies. Therefore, the transmittance of the light is varied by the polarizer attached to the panel assembly 300. By repeating this procedure by a unit of the horizontal period (which is denoted by "1H" and is equal to one period of the horizontal synchronization signal Hsync and the data enable signal DE), all gate lines $G_1$-$G_n$ are sequentially supplied with the gate-on voltage Von during a frame, thereby applying the data signals to all pixels PX to display an image for a frame.

When the next frame starts after finishing one frame, the inversion signal RVS that is applied to the data driver 500 is controlled such that the polarity of the data signals is reversed (which is referred to as "frame inversion"). Here, even in one frame, the polarity of the data signals flowing in a data line may vary (for example, row inversion or dot inversion), or the polarities of the data signals applied to the pixels in a row may be different from each other (for example, column inversion or dot inversion) in accordance with the characteristics of the inversion signal RVS.

Figure 7A:
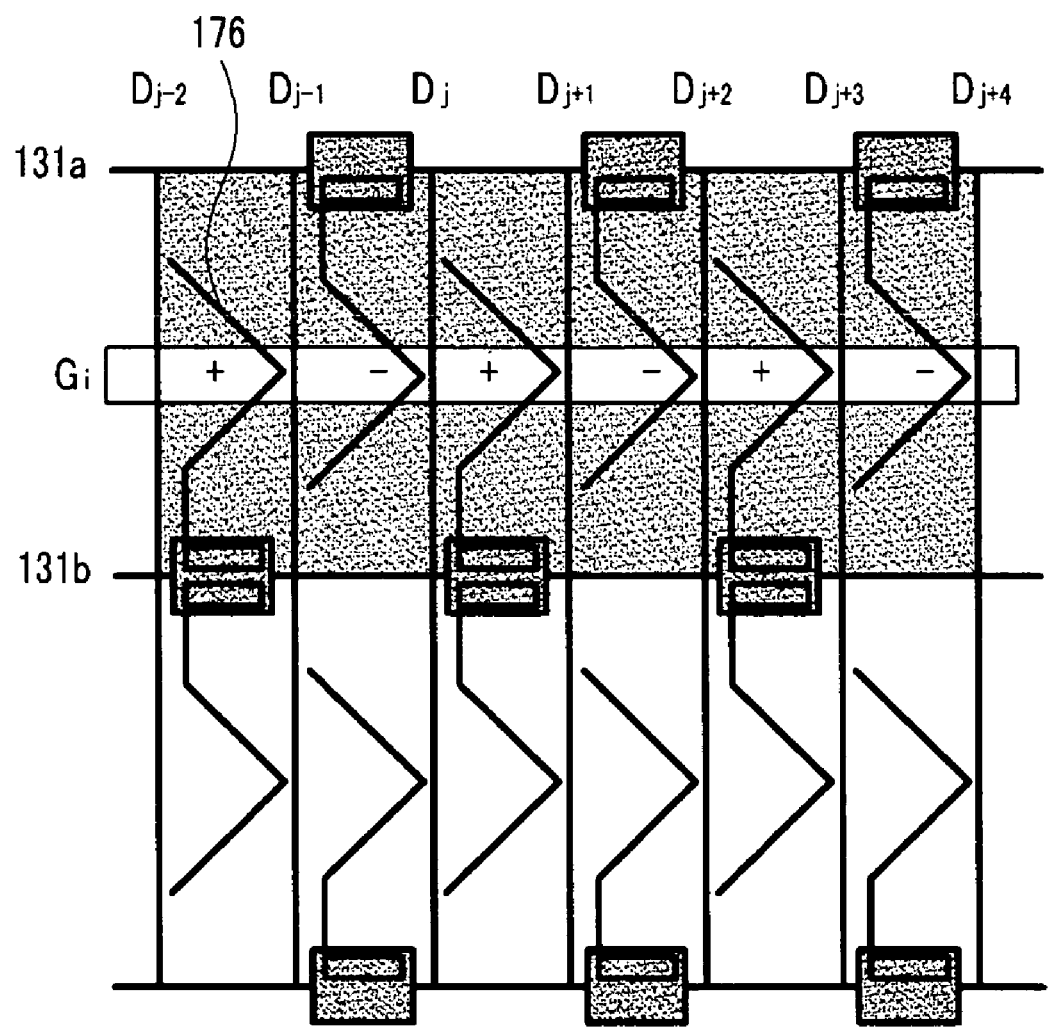
FIG. 7a illustrates the polarities of the pixel electrodes and the direction control electrodes in the i-th row of an LCD according to an embodiment of the present invention when 1×1 dot inversion drive is performed.
Figure 7B:
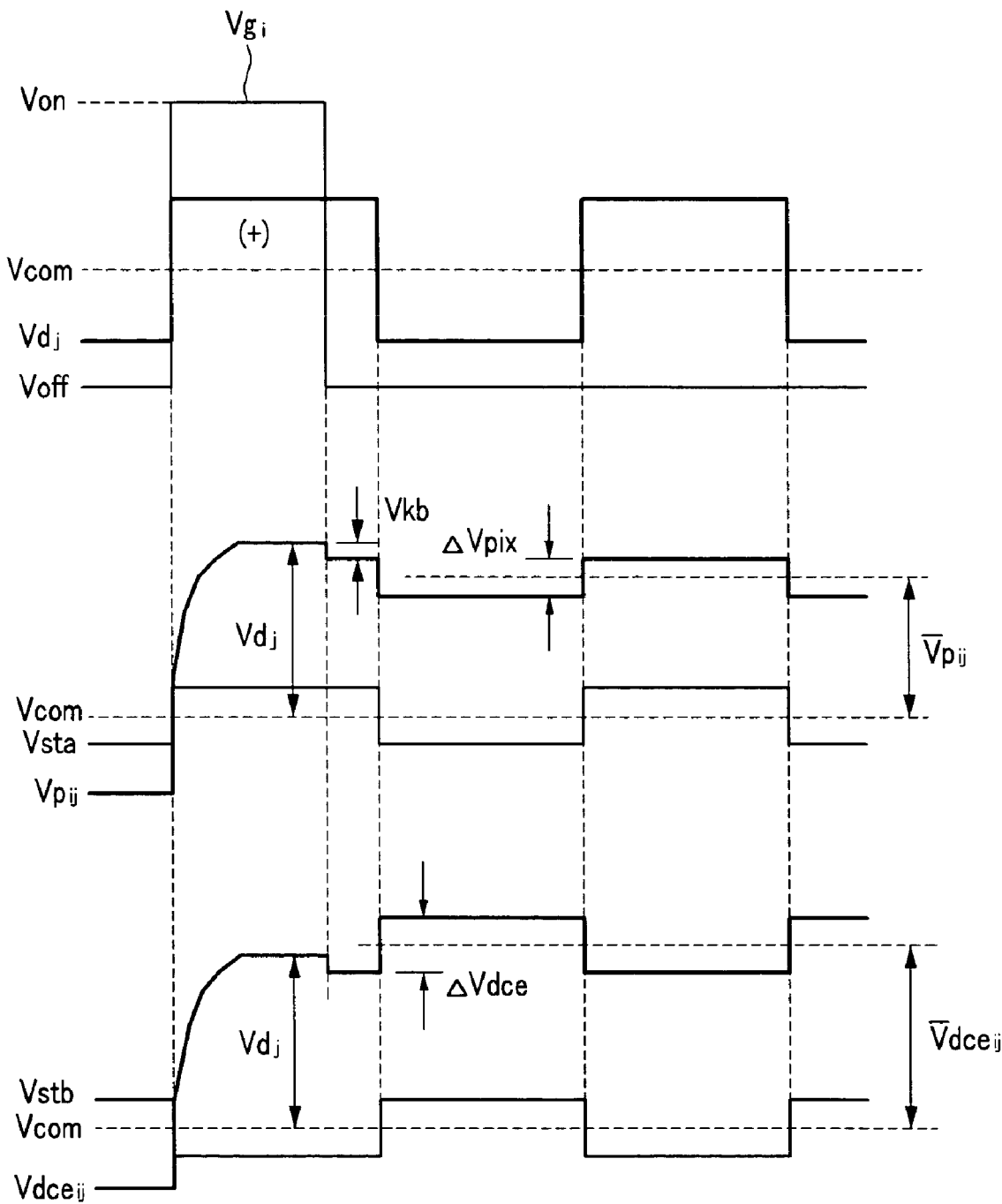
FIG. 7b is a waveform diagram illustrating gate voltages applied to the i-th gate line, data voltages applied to the j-th data line, and voltages of the pixel electrode and the direction control electrode in the i-th row and j-th column of an LCD according to an embodiment of the present invention when 1×1 dot inversion drive is performed.

Now, 1×1 dot inversion drive of an LCD according to an embodiment of the present invention will be described in detail with reference to FIGS. 7a to 8b. FIG. 7a illustrates the polarities of the pixel electrodes and the direction control electrodes in the i-th row of an LCD according to an embodiment of the present invention when 1×1 dot inversion drive is performed. FIG. 7b is a waveform diagram illustrating gate voltages applied to the i-th gate line, data voltages applied to the j-th data line, and voltages of the pixel electrode and the direction control electrode in the i-th row and j-th column of an LCD according to an embodiment of the present invention when 1×1 dot inversion drive is performed.

Figure 7C:
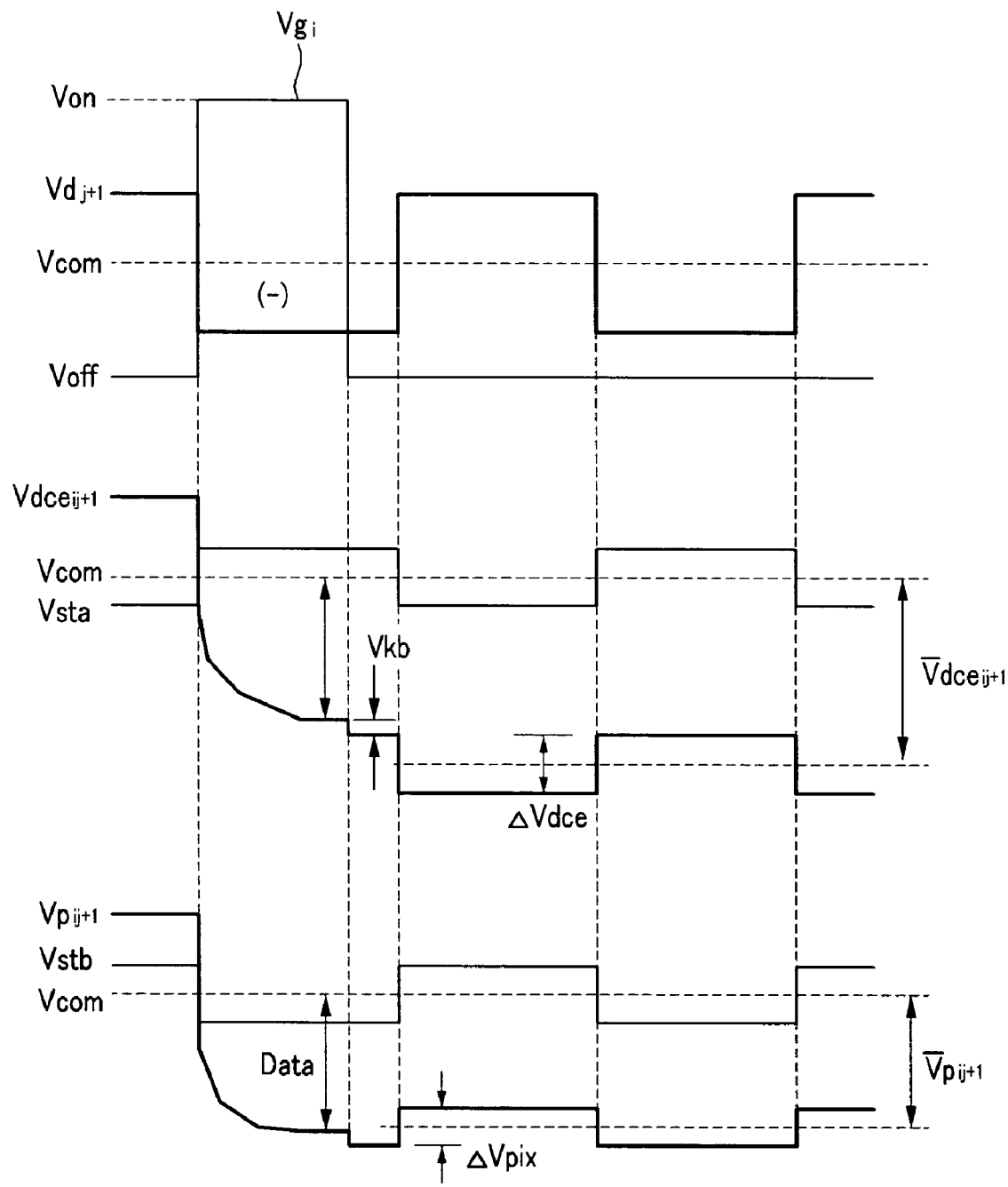
FIG. 7c is a waveform diagram illustrating gate voltages applied to the i-th gate line, data voltages applied to the (j+1)-th data line, and voltages of the pixel electrode and the direction control electrode in the i-th row and (j+1)-th column of an LCD according to an embodiment of the present invention when 1×1 dot inversion drive is performed.
Figure 8A:
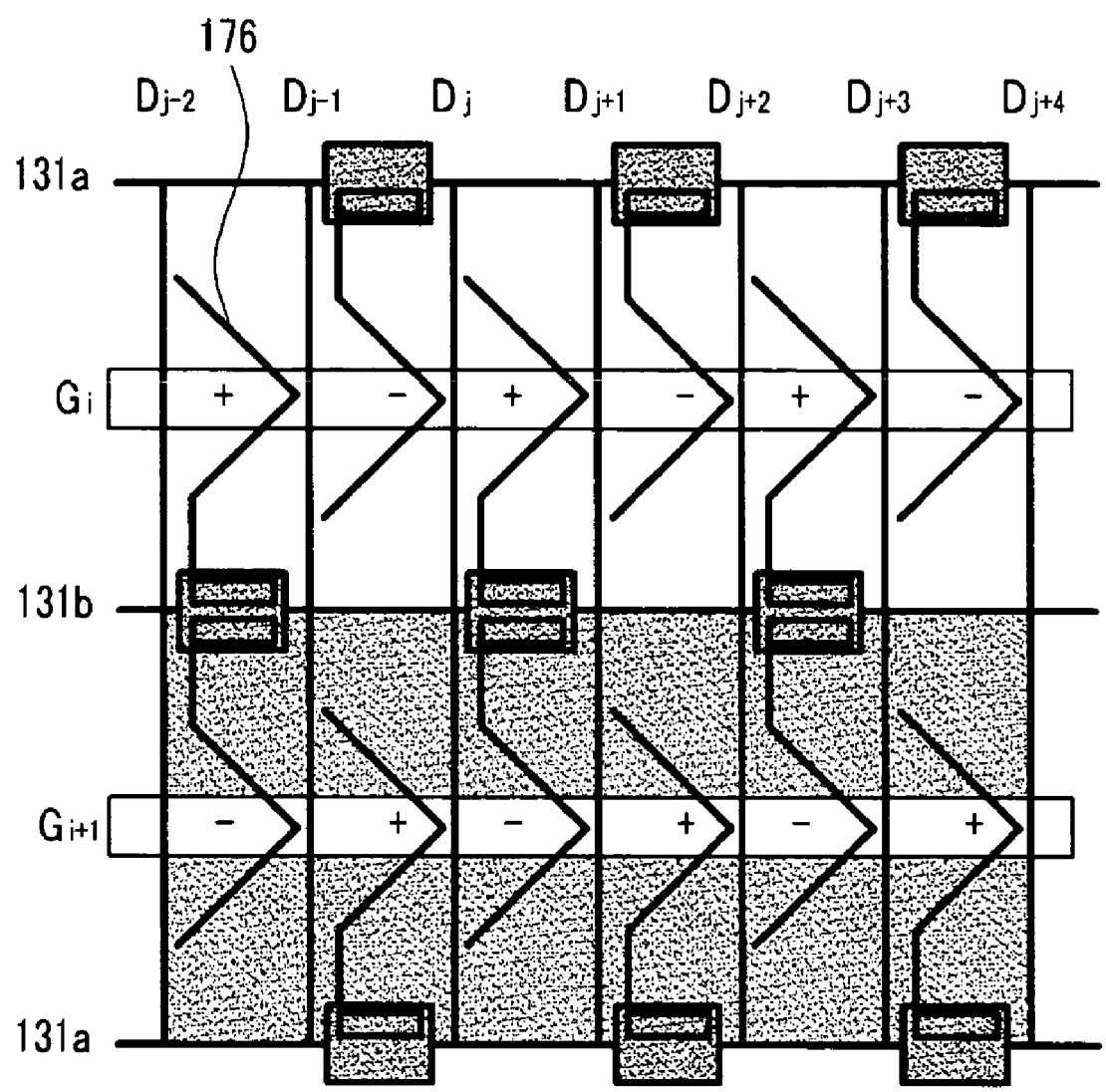
FIG. 8a illustrates the polarities of the pixel electrodes and the direction control electrodes in the (i+1)-th row of an LCD according to an embodiment of the present invention when 1×1 dot inversion drive is performed.
Figure 8B:
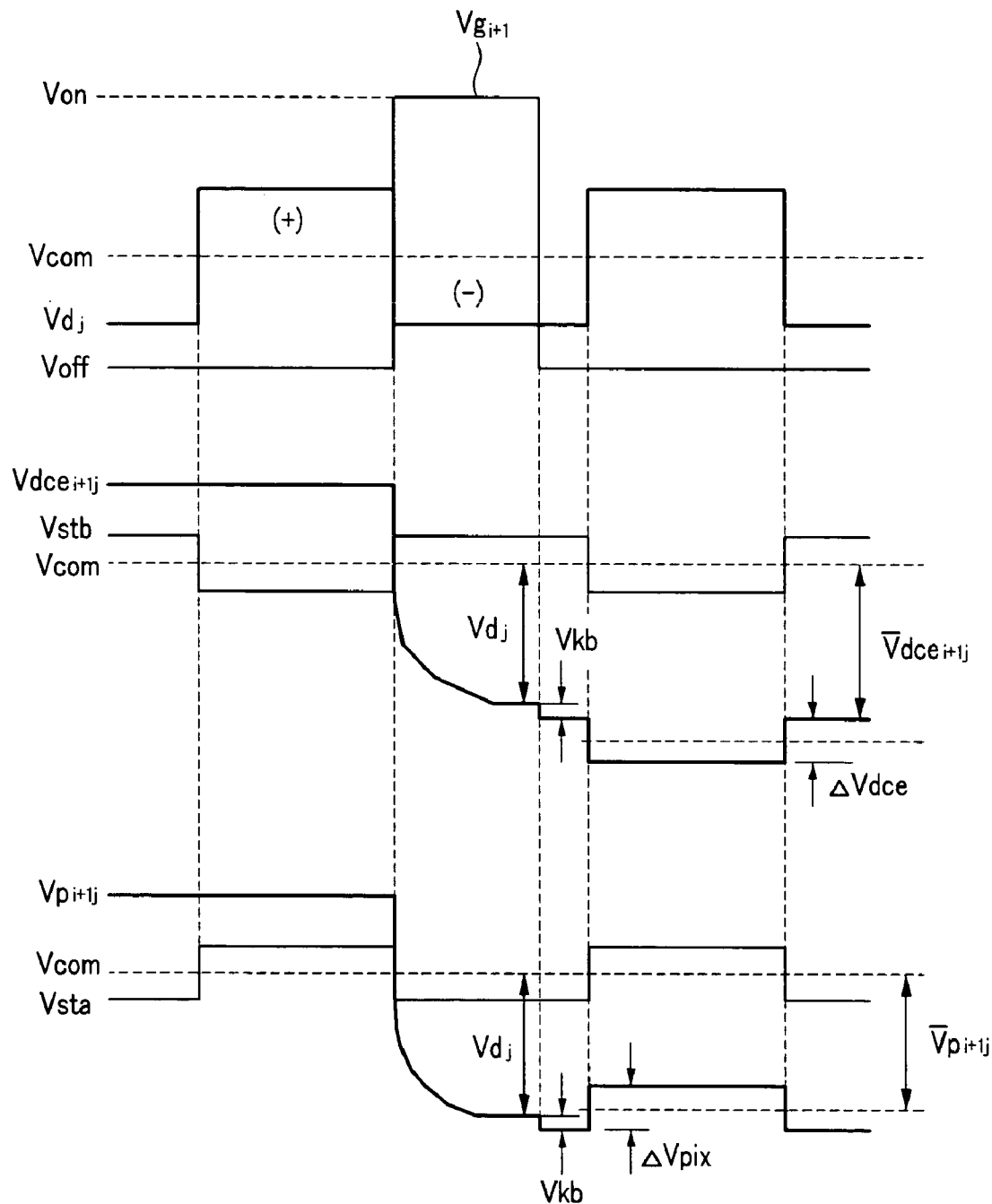
FIG. 8b is a waveform diagram illustrating gate voltages applied to the (i+1)-th gate line, data voltages applied to the j-th data line, and voltages of the pixel electrode and the direction control electrode in the (i+1)-th row and j-th column of an LCD according to an embodiment of the present invention when 1×1 dot inversion drive is performed.

FIG. 7c is a waveform diagram illustrating gate voltages applied to the i-th gate line, data voltages applied to the (j+1)-th data line, and voltages of the pixel electrode and the direction control electrode in the i-th row and (j+1)-th column of an LCD according to an embodiment of the present invention when 1×1 dot inversion drive is performed. FIG. 8a illustrates the polarities of the pixel electrodes and the direction control electrodes in the (i+1)-th row of an LCD according to an embodiment of the present invention when 1×1 dot inversion drive is performed. FIG. 8b is a waveform diagram illustrating gate voltages applied to the (i+1)-th gate line, data voltages applied to the j-th data line, and voltages of the pixel electrode and the direction control electrode in the (i+1)-th row and j-th column of an LCD according to an embodiment of the present invention when 1×1 dot inversion drive is performed.

Referring to FIGS. 7a and 8a, the direction control electrode 176 in the i-th row and j-th column pixel is connected to the second storage electrode line 131b, and the direction control electrode 176 in the i-th row and (j+1)-th column pixel which is adjacent thereto in the row direction is connected to the first storage electrode line 131a. In the LCDs shown in FIGS. 7a and 8a, these two kinds of pixels are arranged alternately in the row and column directions. The direction control electrodes 176 in these two pixels have 180° rotation symmetry or inversion symmetry.

Referring to FIGS. 7b, 7c, and 8b, the polarities of the data voltages $Vd_j$ and $Vd_{j+1}$ and the first and second storage electrode signals Vsta and Vstb are reversed in the period of 1H. The polarity of the first storage electrode signal Vsta is equal to the polarity of the data voltage $Vd_j$ in the j-th data line $D_j$ and is opposite to the polarity of the data voltage $Vd_{j+1}$ in the (j+1)-th data line $D_{j+1}$, and the polarity of the second storage electrode signal Vstb is opposite to the polarity of the data voltage $Vd_j$ in the j-th data line $D_j$ and is equal to the polarity of the data voltage $Vd_{j+1}$ in the (j+1)-th data line $D_{j+1}$.

Referring to FIG. 7b, the polarity of the data voltage $Vd_j$ in the j-th data line $D_j$ is positive while the gate signal $Vg_i$ applied to the i-th gate line $G_i$ is the gate-on voltage Von, and the pixel electrode voltage $Vp_{ij}$ and the direction control electrode voltage $Vdce_{ij}$ in the i-th row and j-th column pixel are charged to the same voltage $Vd_j$ from negative polarity to positive polarity, during which time the polarity of the first storage electrode signal Vsta is positive, and the polarity of the second storage electrode signal Vstb is negative. When the gate signal $Vg_i$ becomes the gate-off voltage Voff, the pixel electrode voltage $Vp_{ij}$ and the direction control electrode voltage $Vdce_{ij}$ drop by the kickback voltage Vkb and vary periodically in accordance with the variation of the first and second storage electrode voltages Vsta and Vstb. Here, the pixel electrode voltage $Vp_{ij}$ has a periodic value that returns to the original voltage after dropping by ΔVpix in accordance with the drop of the first storage electrode signal Vsta, and the direction control electrode voltage $Vdce_{ij}$ has a periodic value that returns to the original voltage after rising by ΔVdce.

Here, the variation ΔVpix of the pixel electrode voltage $Vp_{ij}$) is given by:

$$\Delta Vpix = \Delta Vst \times C_{ST}/(C_{ST}+C_{LC1})$$ Equation 1 where ΔVst represents the voltage variation in the storage electrode line 137a, and each storage capacitor $C_{LC1}$, $C_{LC2}$, $C_{ST}$, and $C_{DCE}$ and their capacitances are denoted as the same reference characters.

If $C_{ST}$ equals $C_{LC1}$, Equation 2 can be calculated as:

$$\Delta Vpix = 0.5\Delta Vst$$ Equation 2

Since the pixel electrode voltage $Vp_{ij}$ is recognized as its average value, it can be expressed as:

$$Vp_{ij} = \overline{V}p_{ij} = Vd_j - 0.5\Delta vpix - Vkb = Vd_j - 0.25\Delta Vst - Vkb$$ Equation 3

The variation ΔVdce of the direction control electrode voltage $Vdce_{ij}$ is given by:

$$\Delta Vdce = \Delta Vst \times C_{DCE}/(C_{DCE}+C_{LC2})$$ Equation 4

Assuming $C_{DCE} \gg C_{LC2}$, since the variation ΔVdce of the direction control electrode voltage $Vdce_{ij}$ is similar to the variation ΔVst of the second storage electrode voltage Vstb, the direction control electrode voltage $Vdce_{ij}$ can be expressed as:

$$Vdce_{ij} = \overline{V}dce_{ij} = Vd_j + 0.5\Delta Vst - Vkb$$ Equation 5

Referring to Equation 3 and Equation 5, the direction control electrode voltage $Vdce_{ij}$ in the i-th row and j-th column pixel is always higher than the pixel electrode voltage $Vp_{ij}$ by 0.75ΔVst, and no matter how the voltage $Vp_{ij}$ of the pixel electrode 191 varies, the direction control electrode voltage $Vdce_{ij}$ with respect to the common voltage Vcom is maintained higher than the pixel electrode voltage $Vp_{ij}$ with respect to the common voltage Vcom. Referring to FIG. 7c, the polarity of the data voltage $Vd_{j+1}$ in the (j+1)-th data line $D_{j+1}$ is negative while the gate signal $Vg_i$ applied to the i-th gate line $G_i$ is the gate-on voltage Von, and the pixel electrode voltage $Vp_{i,j+1}$ and the direction control electrode voltage $Vdce_{i,j+1}$ in the i-th row and (j+1)-th column pixel are charged to the same voltage $Vd_{j+1}$ from positive polarity to negative polarity, during which time the polarity of the first storage electrode signal Vsta is positive, and the polarity of the second storage electrode signal Vstb is negative. When the gate signal $Vg_i$ becomes the gate-off voltage Voff, the pixel electrode voltage $Vp_{i,j+1}$ and the direction control electrode voltage $Vdce_{i,j+1}$ drop by the kickback voltage Vkb and vary periodically in accordance with the variation of the second and the first storage electrode voltages Vstb and Vsta. Here, the direction control electrode voltage $Vdce_{i,j+1}$ has a periodic value that returns to the original voltage after dropping by ΔVdce in accordance with the drop of the first storage electrode signal Vsta, and the pixel electrode voltage $Vp_{i,j+1}$ has a periodic value that returns to the original voltage after rising by ΔVpix.

Here, the pixel electrode voltage $Vp_{i,j+1}$ and the direction control electrode voltage $Vdce_{i,j+1}$ can be expressed respectively as:

$$Vp_{i,j+1} = \overline{Vp}_{i,j+1} = Vd_{j+1} + 0.5\Delta vpix - Vkb = Vd_{j+1} + 0.25\Delta Vst - Vkb \quad \text{Equation 6}$$

$$vdce_{1,j+1} = \overline{Vdce}_{1,j+1} = Vd_{j+1} - 0.5\Delta Vst - Vkb \quad \text{Equation 7}$$

Referring to Equation 6 and Equation 7, the direction control electrode voltage $Vdce_{i,j+1}$ in the i-th row and (j+1)-th column pixel is always lower than the pixel electrode voltage $Vp_{i,j+1}$ by $0.75\Delta Vst$, and no matter how the voltage $Vp_{i,j+1}$ of the pixel electrode 191 varies, the direction control electrode voltage $Vdce_{i,j+1}$ with respect to the common voltage Vcom is maintained higher than the pixel electrode voltage $Vp_{i,j+1}$ with respect to the common voltage Vcom.

Referring to FIG. 8b, the polarity of the data voltage $Vd_j$ in the j-th data line $D_j$ is negative while the gate signal $Vg_{i+1}$ applied to the (i+1)-th gate line $G_{i+1}$ is the gate-on voltage Von, and the pixel electrode voltage $Vp_{i+1,j}$ and the direction control electrode voltage $Vdce_{i+1,j}$ in the (i+1)-th row and j-th column pixel are charged to the same voltage $Vd_j$ from positive polarity to negative polarity, during which time the polarity of the first storage electrode signal Vsta is negative, and the polarity of the second storage electrode signal Vstb is positive. When the gate signal $Vg_{i+1}$ becomes the gate-off voltage Voff, the pixel electrode voltage $Vp_{i+1,j}$ and the direction control electrode voltage $Vdce_{i+1,j}$ drop by the kickback voltage Vkb and vary periodically in accordance with the variation of the first and second storage electrode voltages Vsta and Vstb. Here, the pixel electrode voltage $Vp_{i+1,j}$ has a periodic value that returns to the original voltage after rising by $\Delta Vpix$ in accordance with the rise of the first storage electrode signal Vsta, and the direction control electrode voltage $Vdce_{i+1,j}$ has a periodic value that returns to the original voltage after dropping by $\Delta Vdce$. Further, the pixel electrode voltage $Vp_{i+1,j}$ and the direction control electrode voltage $Vdec_{i+1,j}$ can be expressed respectively as Equation 6 and Equation 7. Therefore, the direction control electrode voltage $Vdce_{i+1,j}$ in the (i+1)-th row and j-th column pixel is always lower than the pixel electrode voltage $Vp_{i+1,j}$ by $0.75\Delta Vst$, and no matter how the voltage $Vp_{i+1,j}$ of the pixel electrode 191 varies, the direction control electrode voltage $Vdce_{i+1,j}$ with respect to the common voltage Vcom is maintained higher than the pixel electrode voltage $Vp_{i+1,j}$ with respect to the common voltage Vcom.

As described above, 1×1 dot inversion drive is performed while always maintaining the direction control electrode voltage with respect to the common voltage higher than the pixel electrode voltage with respect to the common voltage. Now, 2×1 dot inversion drive of an LCD according to an embodiment of the present invention will be described with reference to FIGS. 9a to 10c.

Figure 9A:
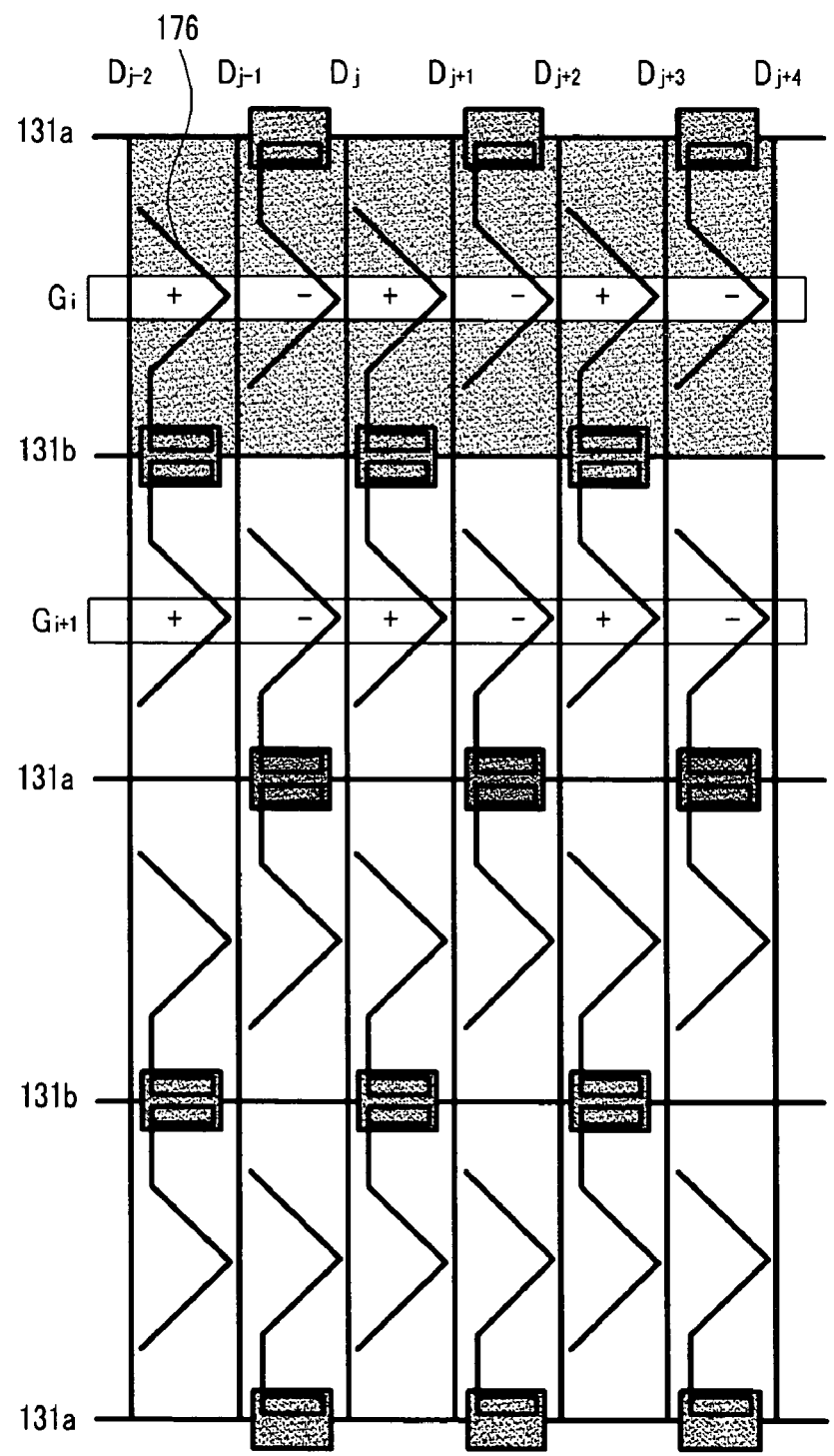
FIG. 9a illustrates the polarities of the pixel electrodes and the direction control electrodes in the i-th and the (i+1)-th rows of an LCD according to an embodiment of the present invention when 2×1 dot inversion drive is performed.
Figure 9B:
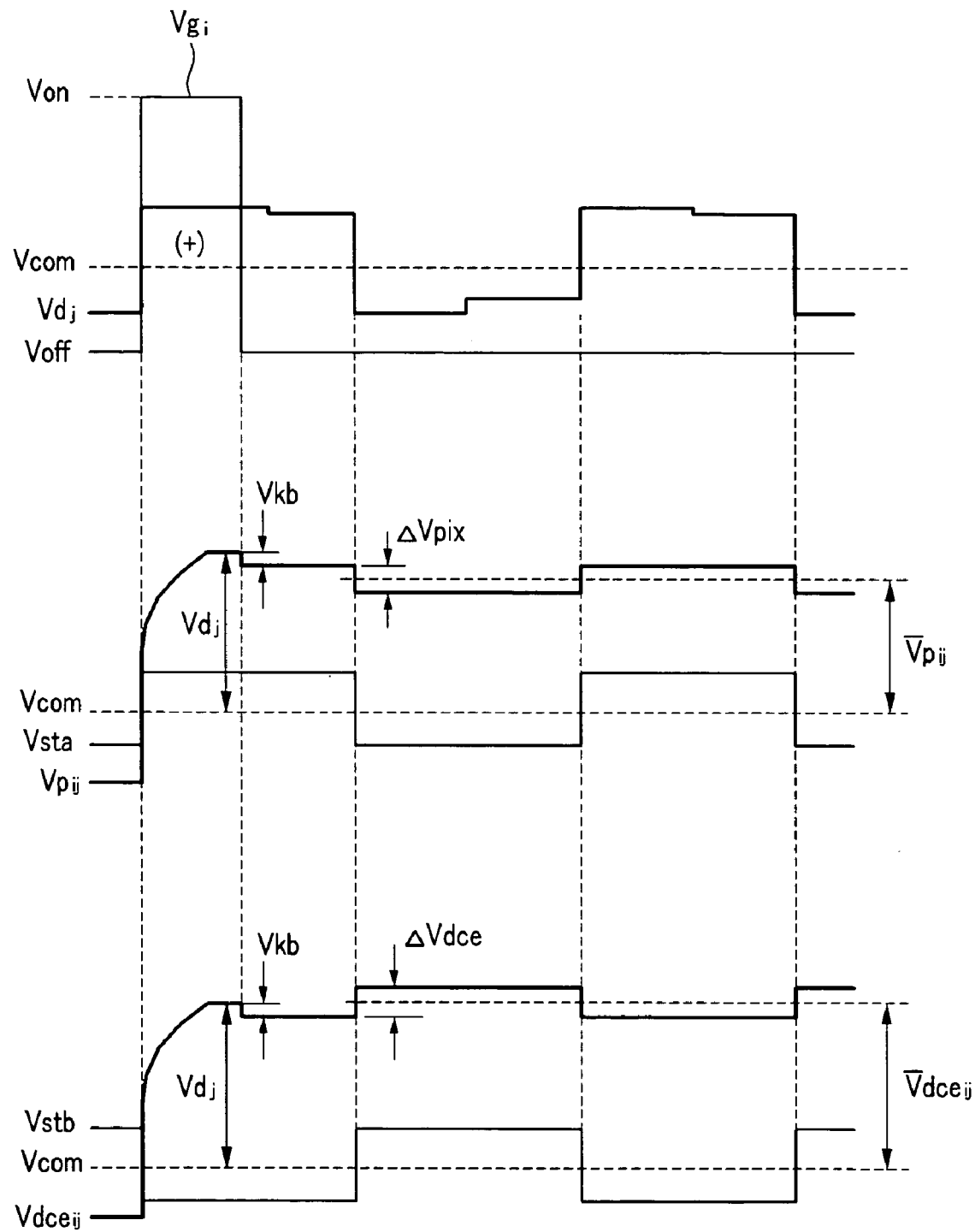
FIG. 9b is a waveform diagram illustrating gate voltages applied to the i-th gate line, data voltages applied to the j-th data line, and voltages of the pixel electrode and the direction control electrode in the i-th row and j-th column of an LCD according to an embodiment of the present invention when 2×1 dot inversion drive is performed.
Figure 9C:
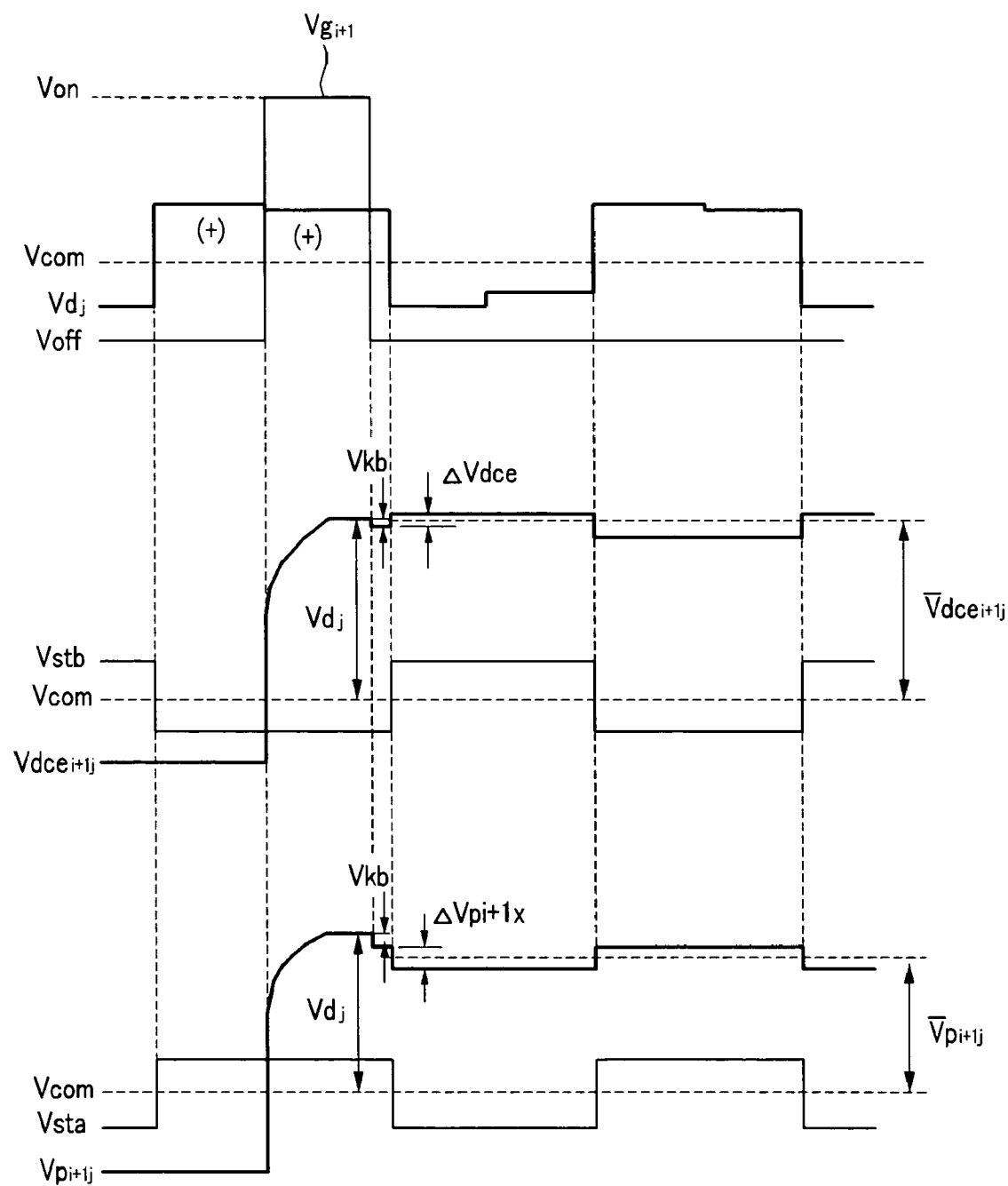
FIG. 9c is a waveform diagram illustrating gate voltages applied to the (i+1)-th gate line, data voltages applied to the j-th data line, and voltages of the pixel electrode and the direction control electrode in the (i+1)-th row and j-th column of an LCD according to an embodiment of the present invention when 2×1 dot inversion drive is performed.

FIG. 9a illustrates the polarities of the pixel electrodes and the direction control electrodes in the i-th and the (i+1)-th rows of an LCD according to an embodiment of the present invention when 2×1 dot inversion drive is performed. FIG. 9b is a waveform diagram illustrating gate voltages applied to the i-th gate line, data voltages applied to the j-th data line, and voltages of the pixel electrode and the direction control electrode in the i-th row and j-th column of an LCD according to an embodiment of the present invention when 2×1 dot inversion drive is performed. FIG. 9c is a waveform diagram illustrating gate voltages applied to the (i+1)-th gate line, data voltages applied to the j-th data line, and voltages of the pixel electrode and the direction control electrode in the (i+1)-th row and j-th column of an LCD according to an embodiment of the present invention when 2×1 dot inversion drive is performed.

Figure 10A:
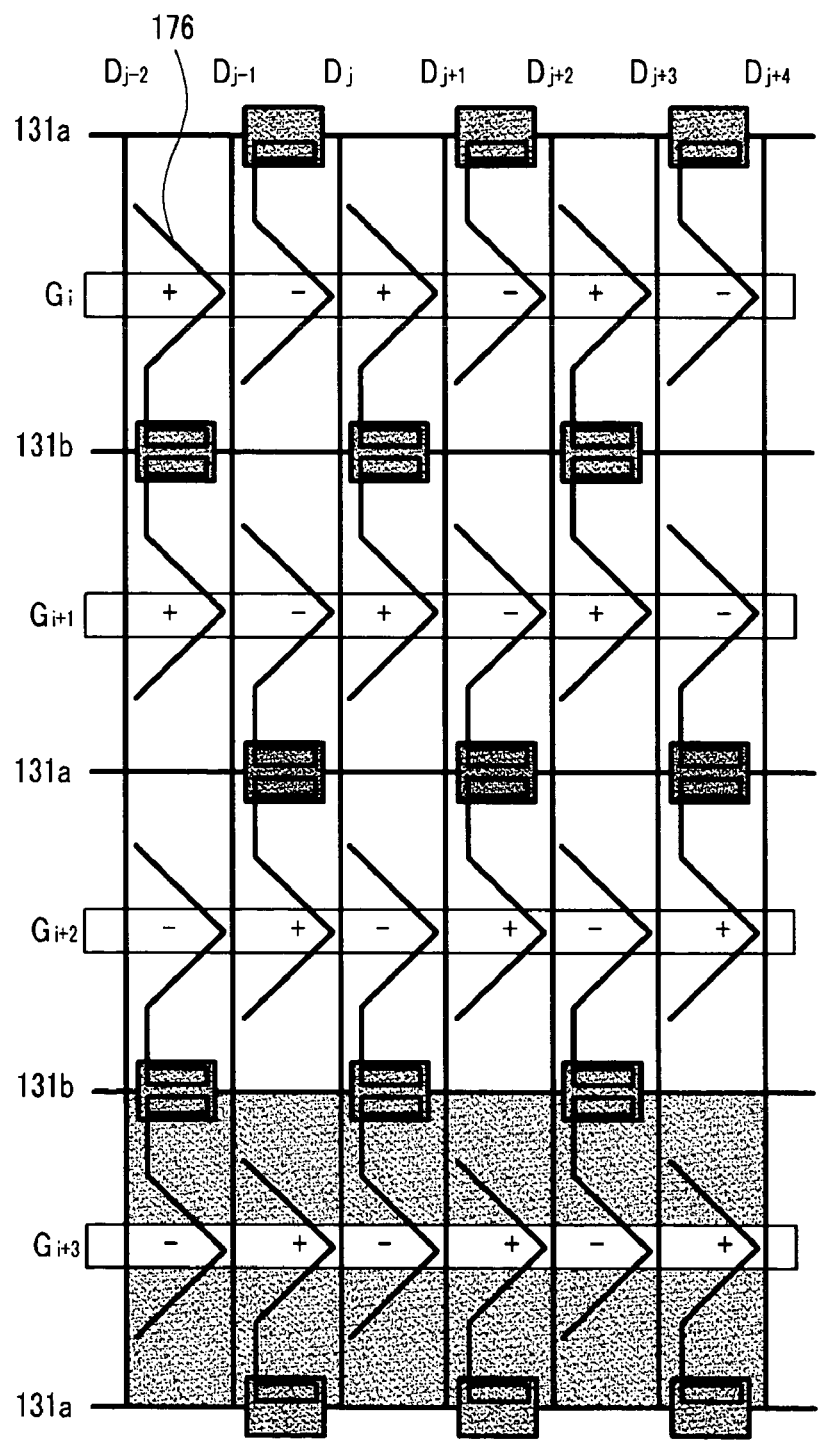
FIG. 10*a* illustrates the polarities of the pixel electrodes and the direction control electrodes in the (i+2)-th and the (i+3)-th rows of an LCD according to an embodiment of the present invention when 2×1 dot inversion drive is performed.
Figure 10B:
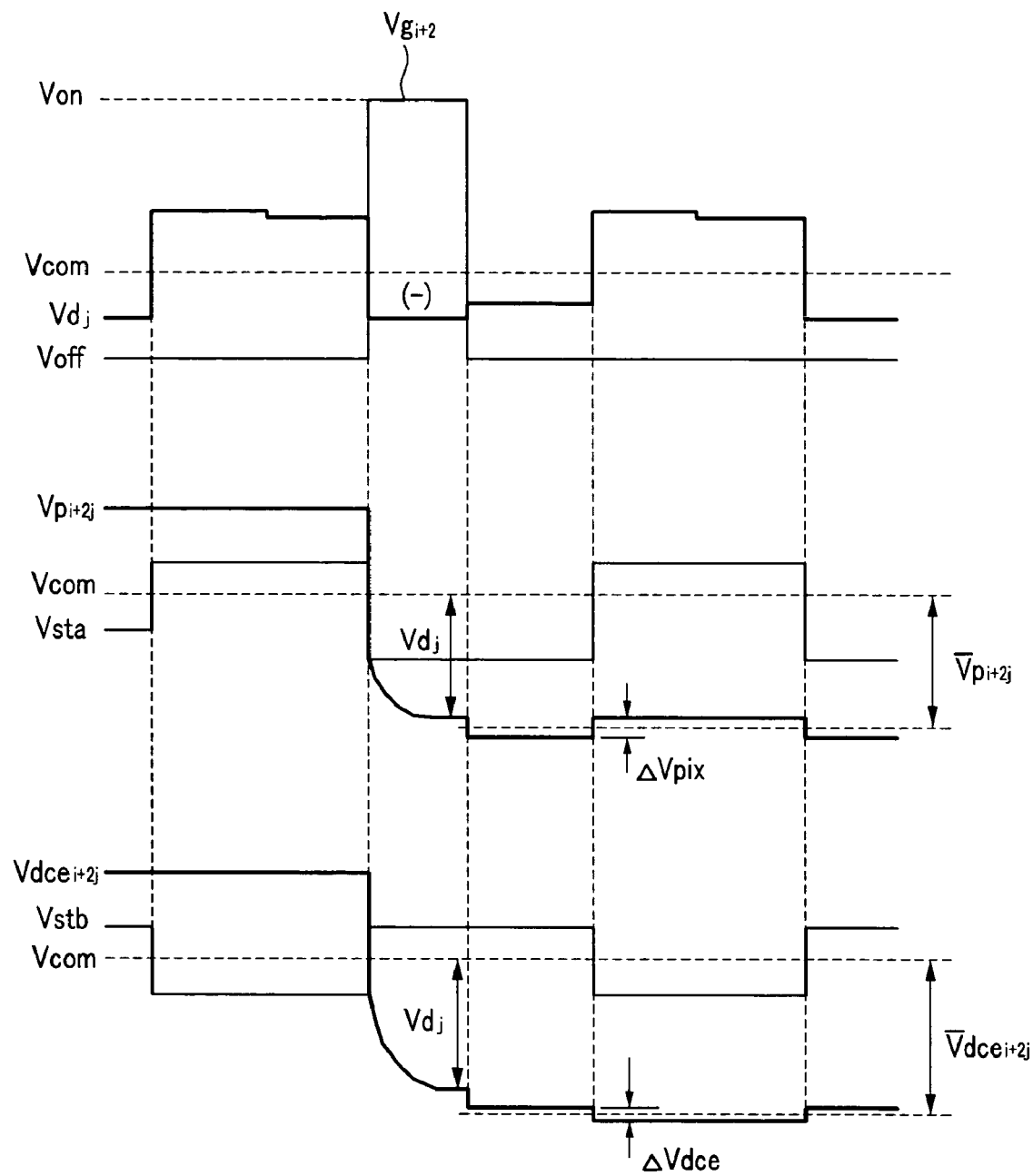
FIG. 10*b* is a waveform diagram illustrating gate voltages applied to the (i+2)-th gate line, data voltages applied to the j-th data line, and voltages of the pixel electrode and the direction control electrode in the (i+2)-th row and j-th column of an LCD according to an embodiment of the present invention when 2×1 dot inversion drive is performed.
Figure 10C:
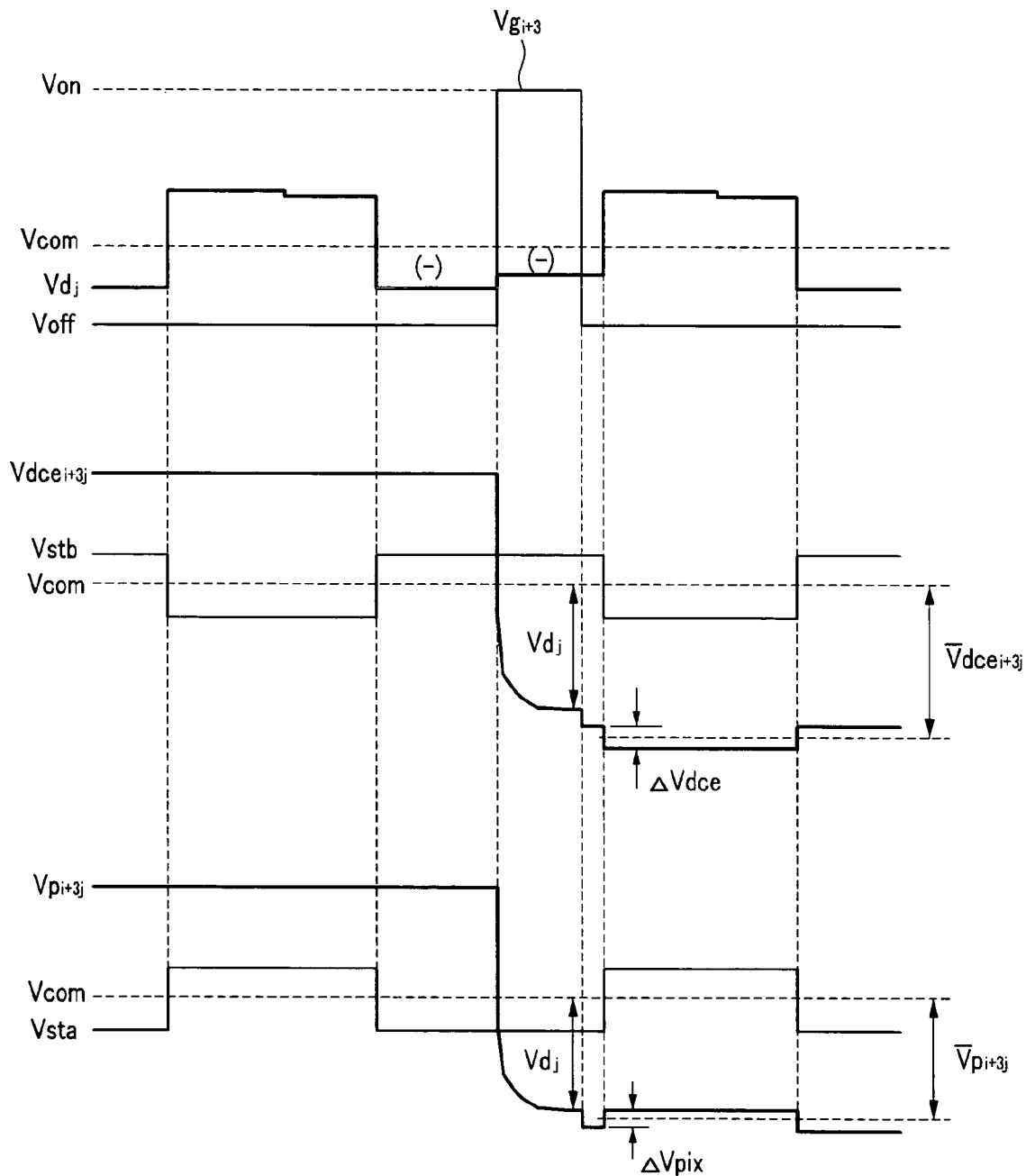
FIG. 10*c* is a waveform diagram illustrating gate voltages applied to the (i+3)-th gate line, data voltages applied to the (j+1)-th data line, and voltages of the pixel electrode and the direction control electrode in the (i+3)-th row and j-th column of an LCD according to an embodiment of the present invention when 2×1 dot inversion drive is performed.

FIG. 10a illustrates the polarities of the pixel electrodes and the direction control electrodes in the (i+2)-th and the (i+3)-th rows of an LCD according to an embodiment of the present invention when 2×1 dot inversion drive is performed. FIG. 10b is a waveform diagram illustrating gate voltages applied to the (i+2)-th gate line, data voltages applied to the j-th data line, and voltages of the pixel electrode and the direction control electrode in the (i+2)-th row and j-th column of an LCD according to an embodiment of the present invention when 2×1 dot inversion drive is performed. FIG. 10c is a waveform diagram illustrating gate voltages applied to the (i+3)-th gate line, data voltages applied to the j-th data line, and voltages of the pixel electrode and the direction control electrode in the (i+3)-th row and j-th column of an LCD according to an embodiment of the present invention when 2×1 dot inversion drive is performed.

The structure of the pixels illustrated in FIGS. 9a and 10a is same as that in FIGS. 7a and 8a. Referring to FIGS. 9b, 9c, 10b, and 10c, the polarities of the data voltage $Vd_j$ and the first and second storage electrode signals Vsta and Vstb are reversed in the period of 2H. The polarity of the first storage electrode signal Vsta is equal to the polarity of the data voltage $Vd_j$ in the j-th data line $D_j$, and the polarity of the second storage electrode signal Vstb is opposite to the polarity of the data voltage $Vd_j$ in the j-th data line $D_j$.

Referring to FIGS. 9b and 9c, the polarity of the data voltage $Vd_j$ in the j-th data line $D_j$ is positive while the gate signals $Vg_i$ and $Vg_{i+1}$ applied to the i-th and the (i+1)-th gate lines $G_i$ and $G_{i+1}$ are the gate-on voltage Von. The pixel electrode voltage $Vp_{ij}$ and the direction control electrode voltage $Vdce_{ij}$ in the i-th row and j-th column pixel are charged to the same voltage $Vd_j$ from negative polarity to positive polarity, and the pixel electrode voltage $Vp_{i+1,j}$ and the direction control electrode voltage $Vdce_{i+1,j}$ in the (i+1)-th row and j-th column pixel are also charged to the same voltage $Vd_j$ from negative polarity to positive polarity. During that time, the polarity of the first storage electrode signal Vsta is positive, and the polarity of the second storage electrode signal Vstb is negative. Therefore, the direction control electrode voltages $Vdce_{ij}$ and $Vdce_{i+1,j}$ are higher than the pixel electrode voltages $Vp_{ij}$ and $Vp_{i+1,j}$ by $0.75\Delta Vst$.

Referring to FIGS. 10b and 10c, the polarity of the data voltage $Vd_j$ in the j-th data line $D_j$ is negative while the gate signals $Vg_{i+2}$ and $Vg_{i+3}$ applied to the (i+2)-th and the (i+3)-th gate lines $G_{i+2}$ and $G_{i+3}$ are the gate-on voltage Von. The pixel electrode voltage $Vp_{i+2,j}$ and the direction control electrode voltage $Vdce_{i+2,j}$ in the (i+2)-th row and j-th column pixel are charged to the same voltage $Vd_j$ from positive polarity to negative polarity, and the pixel electrode voltage $Vp_{i+3,j}$ and the direction control electrode voltage $Vdce_{i+3,j}$ in the (i+3)-th row and j-th column pixel are also charged to the same voltage $Vd_j$ from positive polarity to negative polarity. During that time, the polarity of the first storage electrode signal Vsta is negative, and the polarity of the second storage electrode signal Vstb is positive. Therefore, the direction control electrode voltages $Vdce_{i+2,j}$ and $Vdce_{i+3,j}$ are lower than the pixel electrode voltages $Vp_{i+2,j}$ and $Vp_{i+3,j}$ by $0.75\Delta Vst$.

As described above, by applying the first and second storage electrode voltages Vsta and Vstb by a unit of 2H along with the data voltage $Vd_l$ (l=1~m), the direction control electrode voltage $Vdce_{kl}$ (k=1~n, l=1~m) with respect to the common voltage Vcom is maintained higher than the pixel electrode voltage with respect to the common voltage no matter how the voltage $Vp_{kl}$ (k=1~n, l=1~m) of the pixel electrode 191 varies, and at the same time, 2×1 dot inversion drive, in which adjacent pixels in a row have alternating opposite polarities and the polarity in a column alternates every two pixels, is performed. Now, 2×1 dot inversion drive of an LCD according to another embodiment of the present invention will be described with reference to FIGS. 11a to 11d.

FIGS. 11a to 11d illustrate the polarities of the pixel electrodes and the direction control electrodes in the i-th to (i+3)-th rows of an LCD according to another embodiment of the present invention when 2×1 dot inversion drive is performed. Referring to FIGS. 11a to 11d, the direction control electrode 176 in the i-th row and j-th column pixel is connected to the second storage electrode line 131b, and the direction control electrode 176 in the i-th row and (j+1)-th column pixel which is adjacent thereto in the row direction is connected to the first storage electrode line 131a. In the LCDs shown in FIGS. 11a to 11d, these two kinds of pixels are arranged alternately every pixel in the row direction and are arranged alternately every two pixels in the column direction.

Figure 11A:
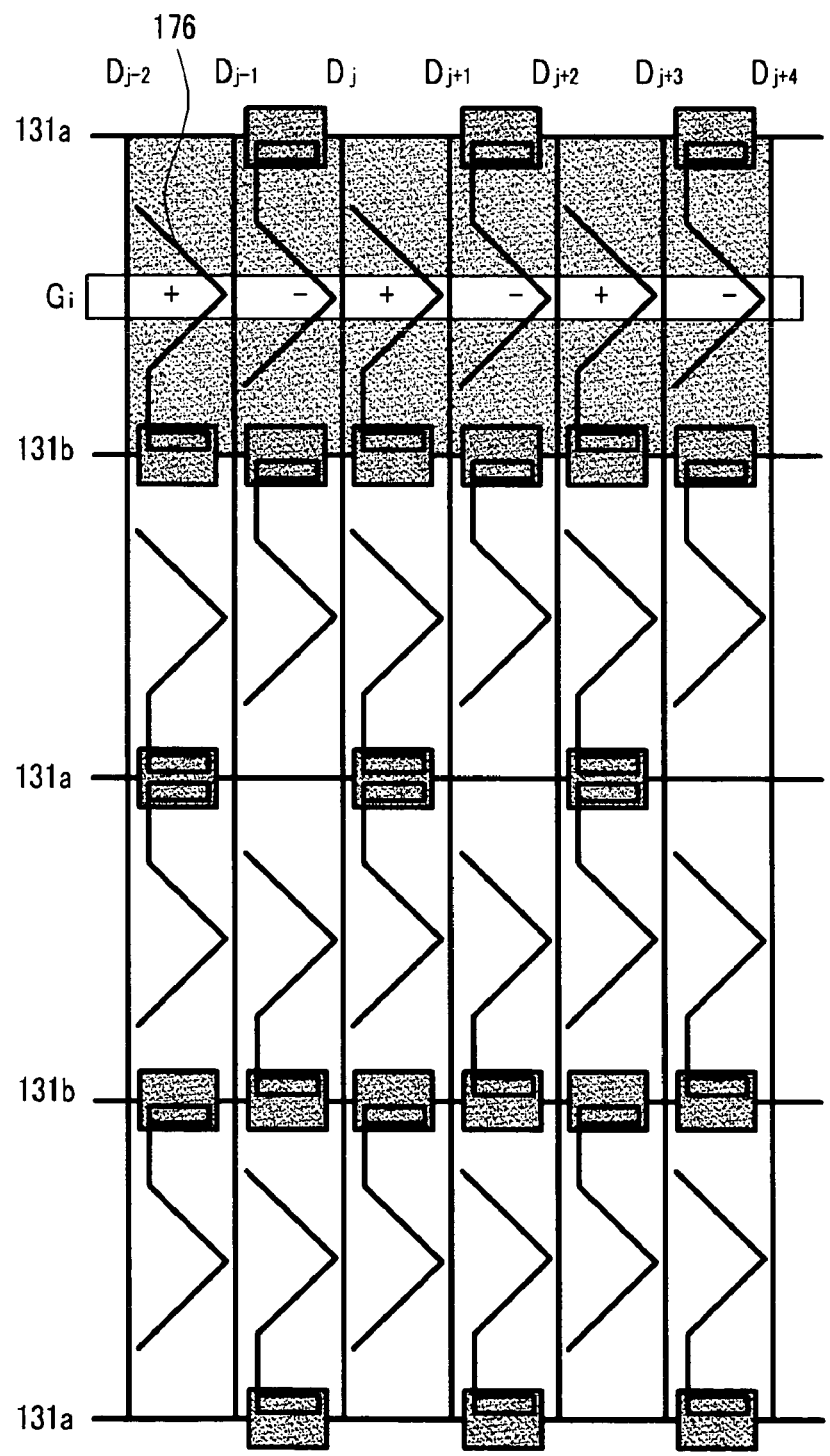
FIGS. 11*a* to 11*d* illustrate the polarities of the pixel electrodes and the direction control electrodes in the i-th to (i+3)-th rows of an LCD according to another embodiment of the present invention when 2×1 dot inversion drive is performed.
Figure 11B:
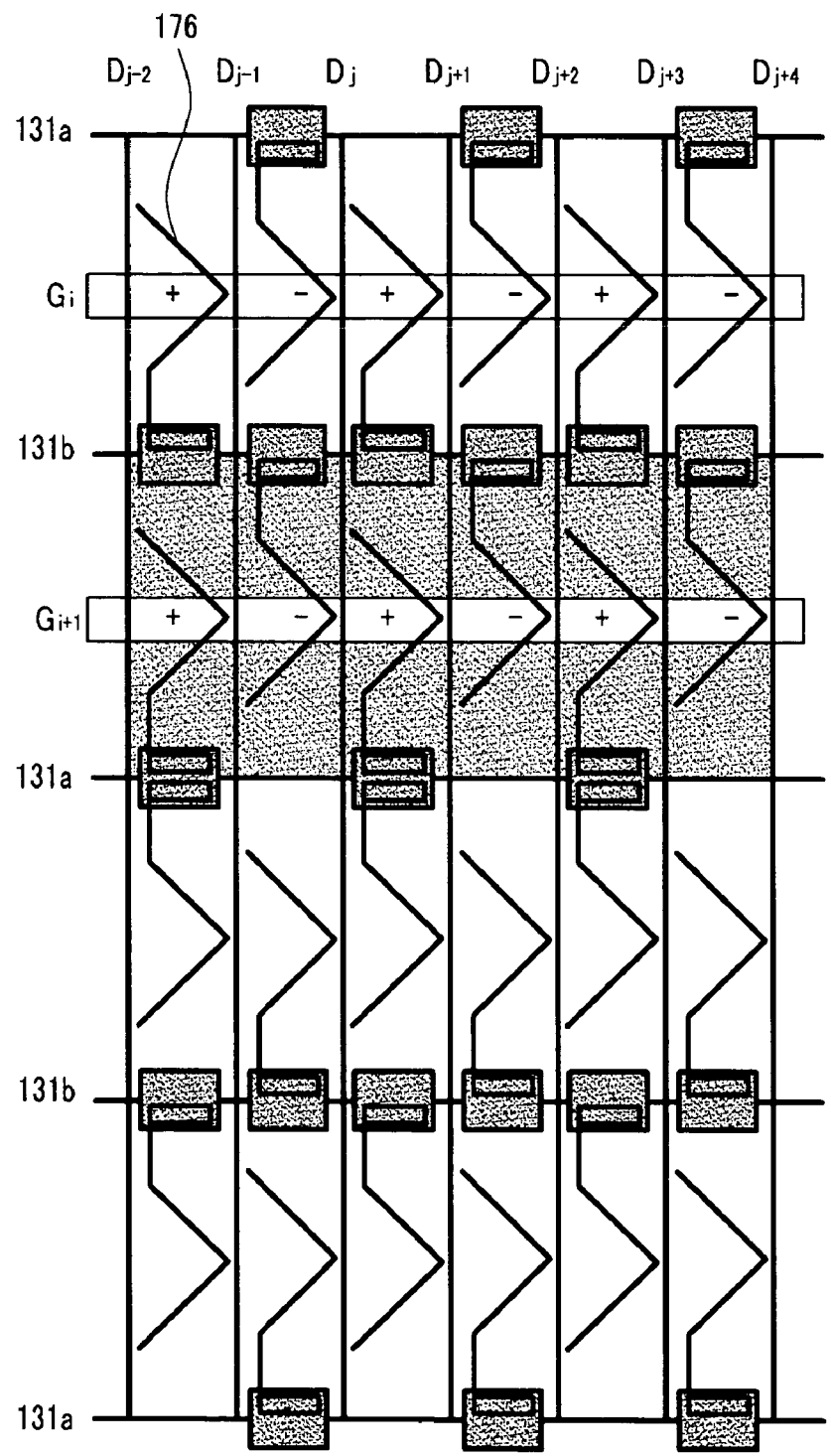

The polarity of the data voltage is reversed in the period of 2H, and the polarity of the first and second storage electrode signals Vsta and Vstb are reversed in the period of 1H. Then, as in FIG. 11a, adjacent pixels have different polarities from each other since each direction control electrode in the i-th row pixels is alternately connected to the first and second storage electrode lines 131a and 131b. Referring to FIGS. 11a and 11b, since the direction control electrodes 176 in the (i+1)-th row are connected to a different storage electrode line unlike the direction control electrodes in the i-th row, and also the pixel electrodes in the (i+1)-th row are connected to a different storage electrode line unlike the pixel electrodes in the i-th row, the polarities of the voltages of the pixel electrodes and the direction control electrodes in the (i+1)-th row are maintained to be the same as those in the i-th row even though the polarity of the voltages in the storage electrode lines 131a and 131b is reversed in the period of 1H.

Figure 11C:
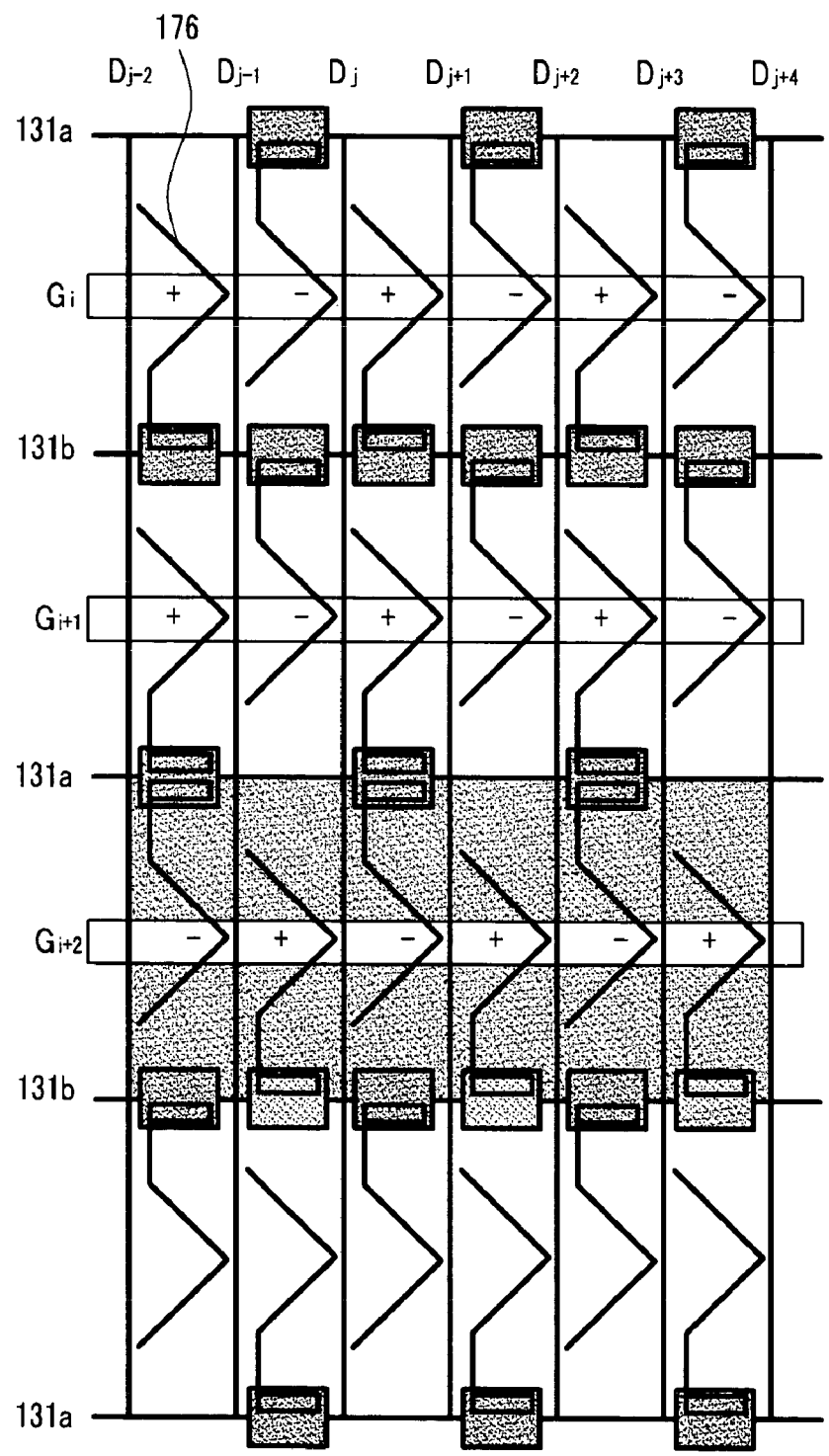
Figure 11D:
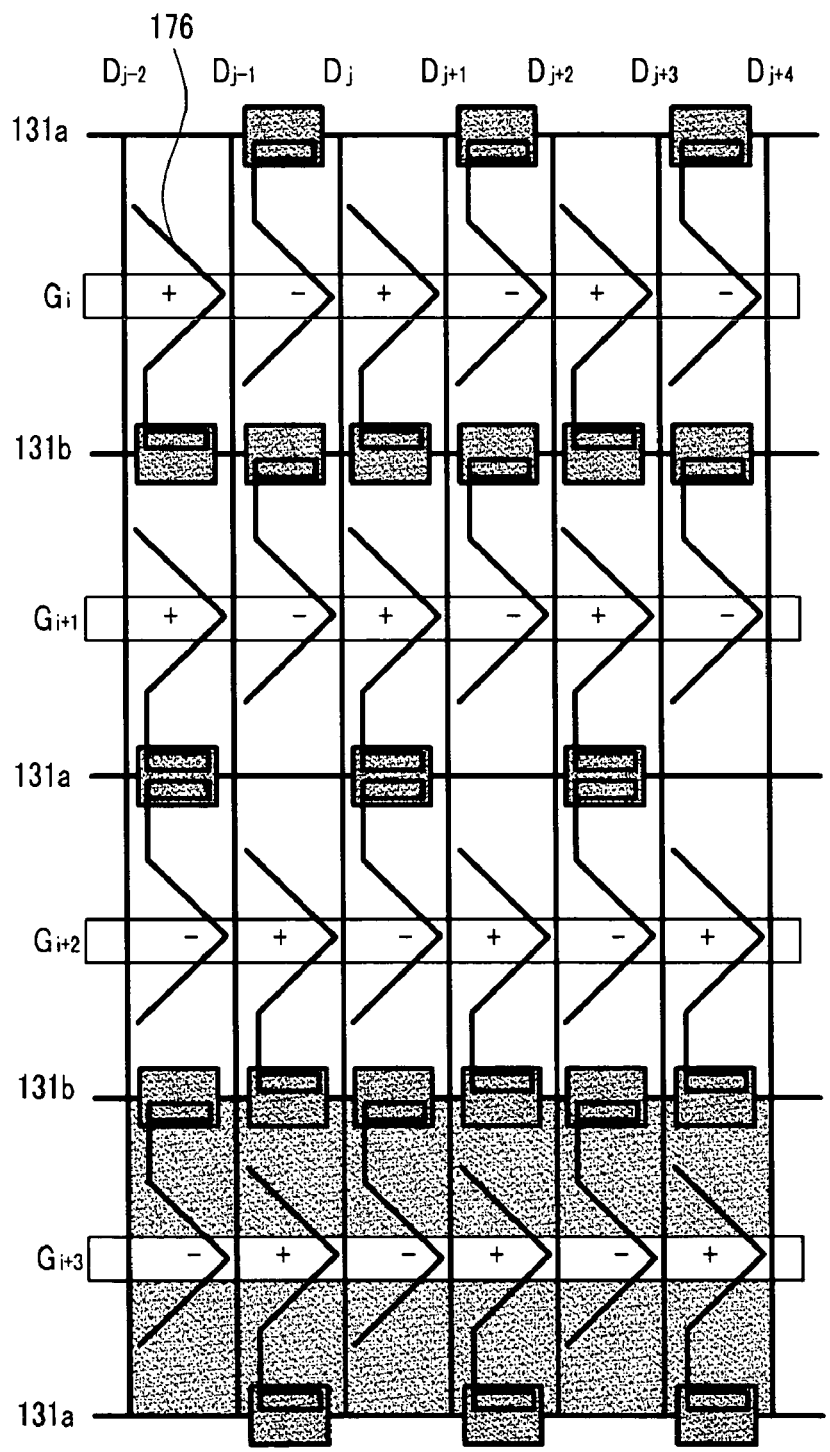

Referring to FIGS. 11c and 11d, the polarities of the voltages of the pixel electrodes and the direction control electrodes in the (i+3)-th row are maintained to be the same as those in the (i+2)-th row and opposite to those in the i-th and the (i+1)-th rows. In FIGS. 11a to 11d, the voltage of the direction control electrode with respect to the common voltage is higher than the voltage of the pixel electrode with respect to the common voltage. In this way, 2×1 dot inversion drive is performed while the direction control electrode voltage with respect to the common voltage is always maintained higher than the pixel electrode voltage with respect to the common voltage in each pixel.

As mentioned above, in the present invention, the electric field generated by the direction control electrode pre-tilts the LC molecules by maintaining the direction control electrode voltage with respect to the common voltage higher than the pixel electrode voltage with respect to the common voltage. Therefore, a wide viewing angle is ensured without forming cutouts or protrusions in the common electrode.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. A thin film transistor array panel comprising:
   a gate line;
   a data line intersecting the gate line;
   a first thin film transistor and a second thin film transistor connected to the gate line and the data line;
   a pixel electrode connected to the first thin film transistor and having a cutout;
   a direction control electrode connected to the second thin film transistor and overlapping the cutout;
   a first storage electrode overlapping the pixel electrode; and
   a second storage electrode overlapping the direction control electrode,
   wherein the first storage electrode is separated from the second storage electrode, and
   wherein the gate line intersects the pixel electrode.

2. The thin film transistor array panel of claim 1, wherein first and second storage voltages having opposite polarities are applied to the first and second storage electrodes, respectively.

3. The thin film transistor array panel of claim 1, wherein voltages of the direction control electrode are higher than voltages of the pixel electrode with respect to a predetermined voltage.

4. The liquid crystal display of claim 1, wherein the gate line intersects the direction control electrode.

5. The liquid crystal display of claim 1, wherein a portion of the pixel electrode or a portion of the direction control electrode is substantially symmetric with reference to the gate line.

6. A liquid crystal display comprising a plurality of gate lines, a plurality of data lines intersecting the gate lines, a plurality of pairs of first and second storage electrode lines, and a plurality of pixels connected to the gate lines and the data lines, wherein each pixel comprises:
   a first liquid crystal capacitor including a pixel electrode having a cutout;
   a second liquid crystal capacitor including a direction control electrode overlapping the cutout;
   a storage capacitor connected to the first liquid crystal capacitor in parallel and connected to one of the first or the second storage electrode lines of the pairs of first and second storage electrode lines; and
   a direction control capacitor connected to the second liquid crystal capacitor in parallel and connected to one of the first or the second storage electrode lines of the pairs of first and second storage electrode lines; wherein the plurality of pixels includes a first pixel wherein the storage capacitor is connected to the first storage electrode line and the direction control capacitor is connected to the second storage electrode line of the pair of first and second storage electrode lines, and a second pixel wherein the storage capacitor is connected to the second storage electrode line of the pair of first and second storage electrode lines and the direction control capacitor is connected to the first storage electrode line of the pair of first and second storage electrode lines, and
   wherein the first storage electrode line is separated from the second storage electrode line, and
   wherein the gate line intersects the pixel electrode.

7. The liquid crystal display of claim 6, wherein the first and second pixels are arranged alternately in a row direction.

8. The liquid crystal display of claim 6, wherein the first and second pixels are arranged alternately in a column direction.

9. The liquid crystal display of claim 6, wherein the first and second pixels are arranged alternately every two pixels in a column direction.

10. The liquid crystal display of claim 7 or 8, wherein data voltages applied to the data lines are subject to 1×1 dot inversion.

11. The liquid crystal display of claim 10, wherein a period of polarity inversion of the first and second storage electrodes voltages is equal to a period of polarity inversion of the data voltages.

12. The liquid crystal display of one of claims 7 to 9, wherein data voltages applied to the data lines are subject to 2×1 dot inversion.

13. The liquid crystal display of claim 12, wherein a period of polarity inversion of the data voltages is twice a period of polarity inversion of voltages applied to the first and second storage electrodes.

14. The liquid crystal display of claim 12, wherein a period of polarity inversion of voltages applied to the first and second storage electrodes is equal to a period of polarity inversion of the data voltages.

15. The liquid crystal display of claim 6, wherein the gate line intersects the direction control electrode.

16. The liquid crystal display of claim 6, wherein a portion of the pixel electrode or a portion of the direction control electrode is substantially symmetric with reference to the gate line.

17. A liquid crystal display comprising:
a gate line;
a data line intersecting the gate line;
a first thin film transistor and a second thin film transistor connected to the gate line and the data line;
a pixel electrode connected to the first thin film transistor and having a cutout;
a direction control electrode connected to the second thin film transistor and overlapping the cutout; a first storage electrode overlapping the pixel electrode;
a second storage electrode overlapping the direction control electrode; and
a common electrode facing the pixel electrode and the direction control electrode and having a continuous surface,
wherein the first storage electrode is separated from the second storage electrode, and
wherein the gate line intersects the pixel electrode.

18. The liquid crystal display of claim 17, wherein the gate line intersects the direction control electrode.

19. The liquid crystal display of claim 17, wherein a portion of the pixel electrode or a portion of the direction control electrode is substantially symmetric with reference to the gate line.

* * * * *